US012777926B2

(12) United States Patent
Kim et al.

(10) Patent No.: US 12,777,926 B2
(45) Date of Patent: Oct. 27, 2026

(54) SEMICONDUCTOR PACKAGE

(71) Applicant: Samsung Electronics Co., Ltd., Suwon-si (KR)

(72) Inventors: Geunwoo Kim, Suwon-si (KR); Kyung Don Mun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 741 days.

(21) Appl. No.: 18/320,527

(22) Filed: May 19, 2023

(65) Prior Publication Data

US 2024/0145329 A1 May 2, 2024

(30) Foreign Application Priority Data

Oct. 31, 2022 (KR) ........................ 10-2022-0143090

(51) Int. Cl.
*H10W 40/10* (2026.01)
*H10W 70/60* (2026.01)
(Continued)

(52) U.S. Cl.
CPC .......... *H10W 40/10* (2026.01); *H10W 70/611* (2026.01); *H10W 70/685* (2026.01);
(Continued)

(58) Field of Classification Search
CPC . H10W 40/10; H10W 90/701; H10W 70/685; H10W 90/00; H10W 74/117;
(Continued)

(56) References Cited

U.S. PATENT DOCUMENTS 9,129,929 B2 9/2015 Lundberg
9,576,933 B1 2/2017 Lo
(Continued)

FOREIGN PATENT DOCUMENTS

JP 2004134480 A 4/2004
JP 2010-258254 A 11/2010
(Continued)

OTHER PUBLICATIONS

US 11,328,974 B2, 05/2022, Costa (withdrawn)

*Primary Examiner* — Jacob Y Choi
*Assistant Examiner* — Neil R Prasad
(74) *Attorney, Agent, or Firm* — Hamess, Dickey & Pierce, P.L.C.

(57) ABSTRACT

A semiconductor package includes a first redistribution substrate, a first semiconductor chip on the first redistribution substrate, a heat dissipation layer on the first semiconductor chip and in contact with an upper surface of the first semiconductor chip, a second redistribution substrate on the heat dissipation layer, a molding layer surrounding the first semiconductor chip and the heat dissipation layer between the first redistribution substrate and the second redistribution substrate, through electrodes vertically penetrating the molding layer and electrically connecting the first redistribution substrate and the second redistribution substrate, the through electrodes being spaced apart from the first semiconductor chip and the heat dissipation layer, and dummy patterns vertically penetrating the molding layer and in contact with a side surface of the first semiconductor chip and a side surface of the heat dissipation layer. The first redistribution substrate includes a first insulating layer, first wiring patterns in the first insulating layer and electrically connecting the first semiconductor chip and the through electrodes, and second wiring patterns in the first insulating
(Continued)

layer, electrically connected to the dummy patterns, and electrically insulated from the first wiring patterns.

20 Claims, 18 Drawing Sheets

(51) Int. Cl.
*H10W 70/685* (2026.01)
*H10W 74/10* (2026.01)
*H10W 90/00* (2026.01)

(52) U.S. Cl.
CPC .......... *H10W 74/117* (2026.01); *H10W 90/00* (2026.01); *H10W 90/701* (2026.01); *H10W 90/724* (2026.01); *H10W 90/794* (2026.01)

(58) Field of Classification Search
CPC ......................... H10W 70/611; H10W 90/794; H10W 90/724
See application file for complete search history.

(56) References Cited

U.S. PATENT DOCUMENTS

| | | | | |
|---|---|---|---|---|
| 10,120,150 | B2 | 11/2018 | Ding et al. | |
| 2009/0184414 | A1* | 7/2009 | Park | H10W 70/095 257/E21.705 |
| 2016/0204080 | A1 | 7/2016 | Kim et al. | |
| 2019/0206839 | A1* | 7/2019 | Balakrishnan | H10W 40/10 |
| 2021/0305112 | A1* | 9/2021 | Tseng | H10P 72/74 |
| 2023/0187307 | A1* | 6/2023 | Yu | H10W 40/255 257/213 |
| 2023/0420330 | A1* | 12/2023 | Sun | H10W 40/228 |

FOREIGN PATENT DOCUMENTS

| | | | |
|---|---|---|---|
| JP | 2020-088213 | A | 6/2020 |
| KR | 101046252 | B1 | 7/2011 |
| KR | 20120025751 | A | 3/2012 |
| KR | 20120077875 | A | 7/2012 |
| KR | 10-2013-0038581 | A | 4/2013 |
| KR | 10-2265243 | B1 | 6/2021 |
| KR | 20220045950 | A | 4/2022 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0143090, filed on Oct. 31, 2022 in the Korean Intellectual Property Office, the entire contents of which are hereby incorporated by reference.

BACKGROUND OF THE INVENTION

An integrated circuit chip may include a semiconductor package so as to be suitably applied to an electronic product. In a general semiconductor package, an integrated circuit chip is mounted on a printed circuit board (PCB) and is electrically connected to the PCB through bonding wirings or bumps. Various research for improving reliability, integration, and miniaturization of the semiconductor package have been conducted with the development of an electronic industry.

SUMMARY

The inventive concepts relate to a semiconductor package, and more particularly, relate to a semiconductor package including a heat dissipation layer.

An object of the inventive concepts is to provide a semiconductor package with improved thermal stability.

The problems to be solved by the inventive concepts are not limited to the problems mentioned above, and other problems not mentioned will be clearly understood by those skilled in the art from the following description.

A semiconductor package according to some example embodiments of the inventive concepts may include a first redistribution substrate, a first semiconductor chip on the first redistribution substrate, a heat dissipation layer on the first semiconductor chip and in contact with an upper surface of the first semiconductor chip, a second redistribution substrate on the heat dissipation layer, a molding layer surrounding the first semiconductor chip and the heat dissipation layer between the first redistribution substrate and the second redistribution substrate, through electrodes vertically penetrating the molding layer and electrically connecting the first redistribution substrate and the second redistribution substrate, the through electrodes being spaced apart from the first semiconductor chip and the heat dissipation layer, and dummy patterns vertically penetrating the molding layer and in contact with a side surface of the first semiconductor chip and a side surface of the heat dissipation layer. The first redistribution substrate may include a first insulating layer, first wiring patterns in the first insulating layer and electrically connecting the first semiconductor chip and the through electrodes, and second wiring patterns in the first insulating layer, electrically connected to the dummy patterns, and electrically insulated from the first wiring patterns.

A semiconductor package according to some example embodiments of the inventive concepts may include a first substrate, a chip structure on the first substrate, the chip structure including a first semiconductor chip and a heat dissipation layer covering an upper surface of the first semiconductor chip, a second substrate on the chip structure, dummy patterns electrically connecting the first substrate and the second substrate and in contact with a side surface of the chip structure, and a connection structure electrically connecting the first substrate and the second substrate and spaced apart from the chip structure. The side surface of the chip structure may have a concave portion toward an inside of the chip structure, and at least a portion of a side surface of each of the dummy patterns may be in contact with the concave portion.

A semiconductor package according to some example embodiments of the inventive concepts may include a first redistribution substrate, a chip structure on the first redistribution substrate, the chip structure including a first semiconductor chip and a heat dissipation layer in contact with an upper surface of the first semiconductor chip, through electrodes spaced apart from the chip structure on the first redistribution substrate, dummy patterns between the chip structure and the through electrodes on the first redistribution substrate and in contact with a side surface of the chip structure, a molding layer surrounding the chip structure, the dummy patterns, and the through electrodes, a second redistribution substrate covering the molding layer, and a second semiconductor chip mounted on the second redistribution substrate through a chip connection terminal. The heat dissipation layer may include a metal.

BRIEF DESCRIPTION OF THE DRAWINGS

Some example embodiments will be more clearly understood from the following brief description taken in conjunction with the accompanying drawings. The accompanying drawings represent non-limiting, example embodiments as described herein.

DETAILED DESCRIPTION

Hereinafter, a semiconductor package according to the inventive concepts will be described with reference to the drawings.

When the words "about" and "substantially" are used in this application in connection with a numerical value, it is intended that the associated numerical value include a tolerance of ±10% around the stated numerical value, unless otherwise explicitly defined. Further, regardless of whether numerical values are modified as "about" or "substantially," it will be understood that these values should be construed as including a of ±10% around the stated numerical value.

When an element is referred to as being "connected to" or "electrically connected to" another element, the element may be directly connected to the other element, or one or more other intervening elements may be present. For example, an element described as being "connected to" another element may be "electrically connected to" the other element. In contrast, when an element is referred to as being "directly connected to" another element there are no intervening elements present.

Figure 1:
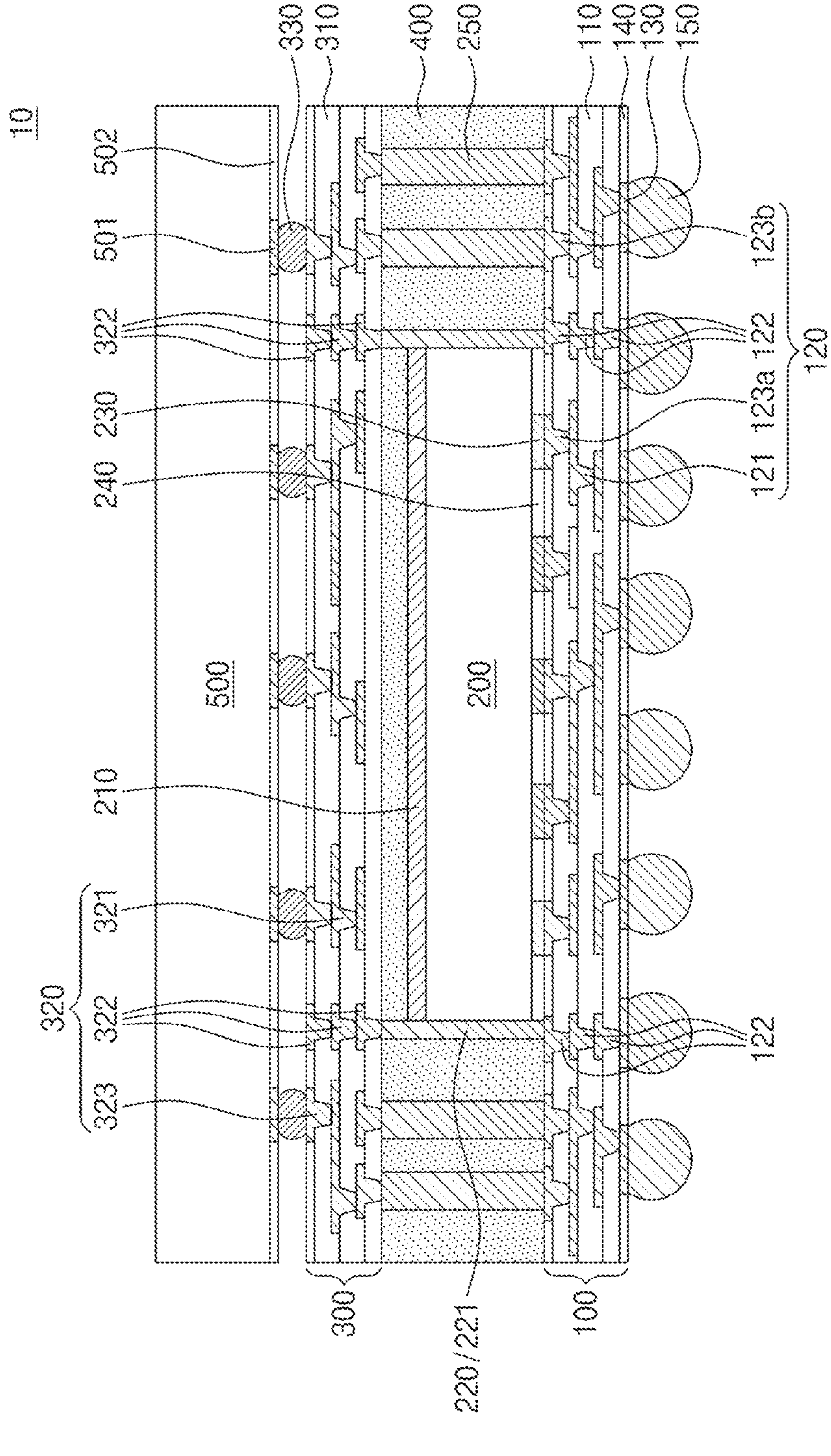
FIG. 1 is a cross-sectional view of a semiconductor package according to some example embodiments of the inventive concepts.
Figure 2:
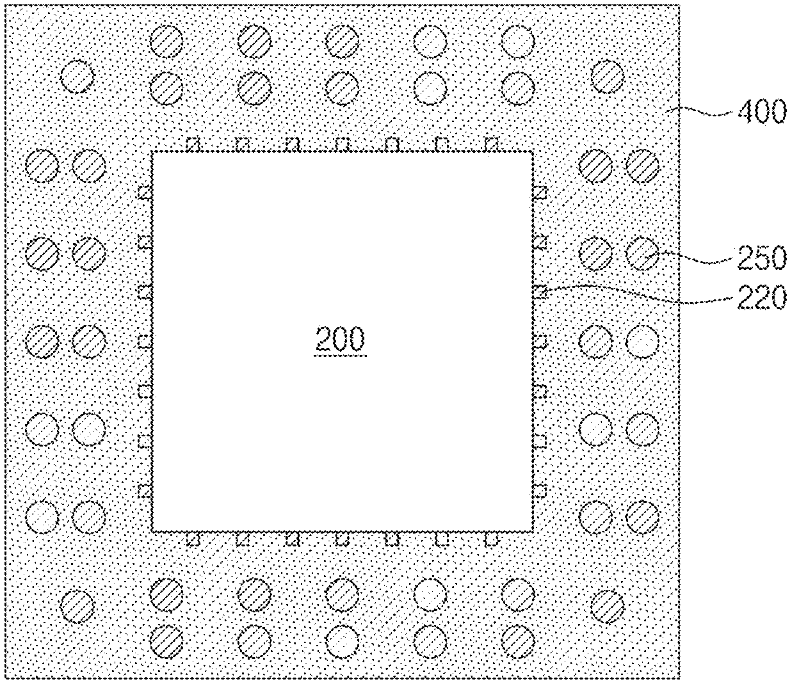
FIG. 2 is a plan view of a semiconductor package according to some example embodiments of the inventive concepts.

FIG. 1 is a cross-sectional view of a semiconductor package according to some example embodiments of the inventive concepts. FIG. 2 is a plan view of a semiconductor package according to some example embodiments of the inventive concepts.

Referring to FIGS. 1 and 2, a semiconductor package 10 may include a first redistribution substrate 100, a first semiconductor chip 200, a heat dissipation layer 210, dummy patterns 220, a through electrode 250, a second redistribution substrate 300, a molding layer 400, and/or a second semiconductor chip 500.

The first redistribution substrate 100 may include a plurality of first insulating layers 110 stacked on each other. The number of stacked first insulating layers 110 may be variously modified. The first insulating layers 110 may include, for example, an organic material such as a photo-imagable dielectric (PID) material. The photo-imagable dielectric material may be a polymer. The photo-imageable dielectric material may include, for example, at least one of photosensitive polyimide, polybenzoxazole, phenol-based polymer, and/or benzocyclobutene-based polymer. In FIG. 1, an interface between the first insulating layers 110 is distinguished but the inventive concepts are not limited thereto. According to some example embodiments, interfaces between adjacent first insulating layers 110 may not be distinguished.

First redistribution patterns 120 may be provided in the first insulating layers 110. Each, or one or more, of the first redistribution patterns 120 may have a first via portion and a first wiring portion integrally connected to each other. The first wiring portion may be a pattern for horizontal connection within the first redistribution substrate 100. The first via portion may be a portion that vertically connects the first redistribution patterns 120 in the first insulating layers 110. The first wiring portion may be provided on the first via portion. The first wiring portion may be connected to the first via portion without an interface. A width of the first wiring portion may be greater than a width of the first via portion. That is, each, or one or more, of the first redistribution patterns 120 may have a T-shaped cross section. The first wiring portion of the first redistribution patterns 120 may be positioned on upper surfaces of the first insulating layers 110. The first via portion of the first redistribution patterns 120 may pass through the first insulating layers 110 and may be connected to the first wiring portion of the other first redistribution patterns 120 disposed thereunder. The first redistribution patterns 120 may include a conductive material. For example, the first redistribution patterns 120 may include copper (Cu).

Although not shown, seed patterns may be respectively disposed on lower surfaces of the first redistribution patterns 120. For example, the seed patterns may cover a lower surface and a sidewall of the first via portion of the corresponding first redistribution patterns 120 and a lower surface of the first wiring portion. The seed patterns may include a material different from that of the first redistribution patterns 120. For example, the seed patterns may include copper (Cu), titanium (Ti), and/or an alloy thereof. The seed patterns may function as a barrier layer and may reduce, or prevent, diffusion of a material included in the first redistribution patterns 120.

The first redistribution patterns 120 may include first wiring patterns 121, second wiring patterns 122, and/or first redistribution pads 123*a* and/or 123*b*. The first redistribution pads 123*a* and/or 123*b* may be uppermost portions of the first redistribution pattern 120 disposed on the first redistribution substrate 100. For example, the first redistribution pads 123*a* and/or 123*b* may be first redistribution patterns 120 exposed on the upper surface of the first redistribution substrate 100. The first redistribution pads 123*a* and/or 123*b* may be connected to the first wiring patterns 121 disposed thereunder.

The first wiring patterns 121 and/or the first redistribution pads 123*a* and/or 123*b* may be wiring patterns for redistribution of the first semiconductor chip 200 by being electrically connected to the first semiconductor chip 200 to be described later. The second wiring patterns 122 may be electrically floating within the first redistribution substrate 100. In this specification, 'floating' means an independent separate circuit that is electrically separated from a target circuit, or completely, (or substantially), electrically insulated. That is, the first wiring patterns 121 and/or the first redistribution pads 123*a* and/or 123*b* may be electrically insulated from the second wiring patterns 122. In the first redistribution substrate 100, the first wiring patterns 121, the first redistribution pads 123*a* and/or 123*b*, and/or the second wiring patterns 122 may not be directly connected to each other.

Substrate pads 130 may be provided under the lowermost first insulating layer 110 among the first insulating layers 110. Substrate pads 130 may be spaced apart from each other. The substrate pads 130 may be connected to the first redistribution patterns 120. For example, the first via portion of the lowermost first redistribution pattern 120 of the first redistribution patterns 120 may pass through the first insulating layer 110 and be connected to the substrate pads 130. Some of the substrate pads 130 may be electrically connected to the first redistribution pads 123 through the first wiring patterns 121. The other of the substrate pads 130 may be connected to the second wiring patterns 122. The substrate pads 130 may include a conductive material. For example, the substrate pads 130 may include copper (Cu).

A substrate protection layer 140 may be provided under the lowermost first insulating layer 110. The substrate protection layer 140 may surround the substrate pads 130 on a lower surface of the lowermost first insulating layer 110. The substrate protection layer 140 may expose lower surfaces of the substrate pads 130. The substrate protection layer 140 may include a solder resist material.

Substrate connection terminals 150 may be disposed on the lower surface of the first redistribution substrate 100. The substrate connection terminals 150 may be provided on the lower surfaces of the exposed substrate pads 130. The substrate connection terminals 150 may include first substrate connection terminals connected to the first wiring patterns 121 through the substrate pads 130 and/or second substrate connection terminals connected to the second wiring patterns 122. The substrate connection terminals 150 may be spaced apart from each other. The substrate connection terminals 150 may include a solder material. For example, the substrate connection terminals 150 may include tin (Sn), bismuth (Bi), lead (Pb), silver (Ag), and/or an alloy thereof.

A chip structure may be disposed on the first redistribution substrate 100. The chip structure may include a first semiconductor chip 200 and/or a heat dissipation layer 210.

The first semiconductor chip 200 may be provided on the first redistribution substrate 100. The first semiconductor chip 200 may be, for example, a logic chip and/or a buffer chip. The logic chip may include an ASIC chip and/or an application processor (AP) chip. Alternatively, the logic chip may include a central processing unit (CPU) and/or a graphics processing unit (GPU). The ASIC chip may include an application specific integrated circuit (ASIC). As another example, the first semiconductor chip 200 may be a memory chip.

The first semiconductor chip 200 may include first chip pads 230 provided on a lower surface of the first semiconductor chip 200. The first chip pads 230 may be electrically connected to an integrated circuit formed in the first semiconductor chip 200. The first chip pads 230 may be exposed on the lower surface of the first semiconductor chip 200. The first chip pads 230 may include a metal. The first chip pads 230 may include, for example, copper (Cu).

A first chip passivation layer 240 may be provided on the lower surface of the first semiconductor chip 200. The first chip passivation layer 240 may surround the first chip pads 230. The first chip pads 230 may be exposed by the first chip passivation layer 240. A lower surface of the first chip passivation layer 240 may be coplanar with a lower surface of the first chip pads 230. The first chip passivation layer 240 may include an insulating material such as silicon oxide (SiO), silicon nitride (SiN), and/or silicon carbon nitride (SiCN).

The first semiconductor chip 200 may be disposed on the first redistribution substrate 100 in a face down manner. For example, the first semiconductor chip 200 may have a front surface facing the first redistribution substrate 100 and a rear surface opposite to the front surface. Hereinafter, in this specification, the front side may be defined as one side of the active surface of a semiconductor substrate on which integrated elements are formed in a semiconductor chip and a side on which pads of the semiconductor chip are formed, and the rear side may be an opposite surface facing the front side. That is, the lower surface of the first semiconductor chip 200 on which the first chip pads 230 are disposed may correspond to the front surface, and the upper surface of the first semiconductor chip 200 may correspond to the rear surface. For example, the first semiconductor chip 200 may be disposed so that a front surface thereof faces the first redistribution substrate 100.

The first semiconductor chip 200 may be connected to the first redistribution substrate 100. In detail, the first chip passivation layer 240 of the first semiconductor chip 200 may be in contact with the uppermost portion of the first insulating layer 110 on the first redistribution substrate 100, and the first redistribution pads 123*a* and the first chip pads 230 may come into contact with each other to form an integral body at an interface between the first chip passivation layer 240 and the uppermost first insulating layer 110. In this case, the first redistribution pads 123*a* and the first chip pads 230 may form inter-metal hybrid bonding. In this specification, hybrid bonding means bonding in which two constituents including the same material are fused at their interfaces. For example, the bonded first redistribution pads 123*a* and the first chip pads 230 may have a continuous configuration. An interface between the first redistribution pads 123*a* and the first chip pads 230 may not be visually distinguished. The first redistribution pads 123*a* and the first chip pads 230 may be formed of the same material, and thus there may be no interface between the first redistribution pads 123*a* and the first chip pads 230. That is, the first redistribution pads 123*a* and the first chip pads 230 may be provided as one component.

The heat dissipation layer 210 may be provided on the first semiconductor chip 200. The heat dissipation layer 210 may cover an upper surface of the first semiconductor chip 200. A lower surface of the heat dissipation layer 210 may be in contact with the upper surface of the first semiconductor chip 200. The upper surface of the first semiconductor chip 200 may not be exposed by the heat dissipation layer 210. A side surface of the heat dissipation layer 210 may be vertically aligned with a side surface of the first semiconductor chip 200, but the inventive concepts are not limited thereto. The heat dissipation layer 210 may include a material having high thermal conductivity. The heat dissipation layer 210 may include a metal. For example, the heat dissipation layer 210 may include copper (Cu).

The molding layer 400 may be disposed on the first redistribution substrate 100. The molding layer 400 may cover the upper surface of the first redistribution substrate 100 and surround the chip structure. The molding layer 400 may surround side surfaces of the first semiconductor chip 200. The molding layer 400 may surround side surfaces of the heat dissipation layer 210 and cover the upper surface of the heat dissipation layer 210. The molding layer 400 may fill a gap between the heat dissipation layer 210 and the second redistribution substrate 300 to be described later. A side surface of the molding layer 400 may be vertically aligned with a side surface of the first redistribution substrate 100. The molding layer 400 may include an insulating polymer such as an epoxy-based molding compound (EMC).

The dummy patterns 220 may be provided on the first redistribution substrate 100. The dummy patterns 220 may be spaced apart from each other on the first redistribution substrate 100. The dummy patterns 220 may be in contact with side surfaces of the first semiconductor chip 200 and the heat dissipation layer 210. The dummy patterns 220 may surround the first semiconductor chip 200 and/or the heat dissipation layer 210. For example, the dummy patterns 220 may be arranged along the side surface of the first semiconductor chip 200 when viewed in plan view. A portion of a side surface of each, or one or more, of the dummy patterns 220 may be in contact with the first semiconductor chip 200 and/or the heat dissipation layer 210, and another portion of the side surface may be in contact with the molding layer 400. That is, the dummy patterns 220 may be interposed between the molding layer 400 and the first semiconductor chip 200 and between the molding layer 400 and the heat dissipation layer 210. The dummy patterns 220 may be disposed between the first semiconductor chip 200 and the heat dissipation layer 210 and the through electrodes 250. The dummy patterns 220 may vertically penetrate the molding layer 400 and be connected to the first redistribution substrate 100. Lower surfaces of the dummy patterns 220 may be in contact with the second wiring patterns 122, which are exposed onto the upper surface of the first redistribution substrate 100, at the upper surface of the first redistribution substrate 100. The dummy patterns 220 may connect the heat dissipation layer 210 and the second wiring patterns 122.

Upper surfaces of the dummy patterns 220 may be coplanar with the upper surface of the molding layer 400. A vertical level of the upper surface of each, or one or more, of the dummy patterns 220 may be higher than a vertical level of the upper surface of the heat dissipation layer 210. Each, or one or more, of the dummy patterns 220 may have a rectangular pillar shape. However, each, or one or more, of the dummy patterns 220 may be formed in various shapes as needed, and according to some example embodiments, each, or one or more, of the dummy patterns 220 may have a cylindrical shape. Alternatively, the dummy patterns 220 may have a barrier rib shape extending along a side surface of the chip structure. A width of the dummy patterns 220 may be constant regardless of a distance from the first redistribution substrate 100. Alternatively, the dummy patterns 220 may have a narrower width toward the first redistribution substrate 100. The dummy patterns 220 may include a metal. The dummy patterns 220 may include, for example, copper (Cu).

The through electrode 250 may be provided on the first redistribution substrate 100. The through electrode 250 may be provided in plurality. The through electrodes 250 may be spaced apart from each other on the first redistribution substrate 100. The through electrodes 250 may be disposed outside the first semiconductor chip 200, the heat dissipation layer 210, and/or the dummy patterns 220 to surround the first semiconductor chip 200, the heat dissipation layer 210, and/or the dummy patterns 220. For example, when viewed from a plan view, the through electrodes 250 may be disposed between the side surface of the first redistribution substrate 100 and the first semiconductor chip 200 or between the side surface of the first redistribution substrate 100 and the dummy patterns 220. The through electrodes 250 may be spaced apart from the first semiconductor chip 200, the heat dissipation layer 210, and/or the dummy patterns 220. The through electrodes 250 may vertically penetrate the molding layer 400 and be connected to the first redistribution substrate 100. Side surfaces of the through electrodes 250 may be surrounded by the molding layer 400. Lower surfaces of the through electrodes 250 may be in contact with the first redistribution pads **123*b* exposed on the upper surface of the first redistribution substrate 100. The through electrodes 250 may be electrically connected to the first semiconductor chip 200 through the first redistribution pads 123*b* and/or the first wiring patterns 121. The through electrodes 250 may be electrically insulated from the dummy patterns 220. The through electrodes 250 may be a connection structure for electrically connecting the first redistribution substrate 100 and the second redistribution substrate 300** to be described later.

Upper surfaces of the through electrodes 250 may be coplanar with the upper surface of the molding layer 400. The upper surfaces of the through electrodes 250 may be positioned at substantially the same vertical level as the upper surfaces of the dummy patterns 220. Each, or one or more, of the through electrodes 250 may have a cylindrical shape. However, each, or one or more, of the through electrodes 250 may be formed in various shapes as needed, and each, or one or more, of the through electrodes 250 may have a square pillar shape. A width of the through electrodes 250 may be constant regardless of a distance from the first redistribution substrate 100. Alternatively, the width of the through electrodes 250 may become narrower toward the first redistribution substrate 100. The through electrodes 250 may include a metal. For example, the through electrodes 250 may include copper (Cu) or tungsten (W).

The second redistribution substrate 300 may be provided on the molding layer 400. The second redistribution substrate 300 may cover the upper surfaces of the dummy patterns 220, through electrodes 250, and/or the molding layer 400.

The second redistribution substrate 300 may include a plurality of second insulating layers 310 stacked on each other. The stacked number of the second insulating layers 310 may be variously modified. The second insulating layers 310 may include, for example, an organic material such as a photo-imageable dielectric (PID) material. The photo-imageable dielectric material may be a polymer. The photo-imageable dielectric material may include, for example, at least one of photosensitive polyimide, polybenzoxazole, phenol-based polymer, and/or benzocyclobutene-based polymer. In FIG. 1, an interface between the second insulating layers 310 is distinguished, but the inventive concepts are not limited thereto. According to some example embodiments, interfaces between adjacent second insulating layers 310 may not be distinguished.

Second redistribution patterns 320 may be provided in the second insulating layers 310. Each, or one or more, of the second redistribution patterns 320 may have a second via portion and a second wiring portion integrally connected to each other. The second wiring portion may be a pattern for horizontal connection within the second redistribution substrate 300. The second via portion may be a portion that vertically connects the second redistribution patterns 320 in the second insulating layers 310. The second wiring portion may be provided on the second via portion. The second wiring portion may be connected to the second via portion without an interface. A width of the second wiring portion may be greater than a width of the second via portion. That is, each, or one or more, of the second redistribution patterns 320 may have a T-shaped cross section. The second wiring portion of the second redistribution patterns 320 may be positioned on upper surfaces of the second insulating layers 310. The second via portion of the second redistribution patterns 320 may pass through the second insulating layers 310 and be connected to the second wiring portions of other second redistribution patterns 320 disposed thereunder. The second redistribution patterns 320 may include a conductive material. For example, the second redistribution patterns 320 may include copper (Cu).

Although not shown, seed patterns may be respectively disposed on lower surfaces of the second redistribution patterns 320. For example, the seed patterns may cover a lower surface and/or a sidewall of the second via portion of the corresponding second redistribution patterns 320 and/or a lower surface of the second wiring portion. The seed patterns may include a material different from that of the second redistribution patterns 320. For example, the seed patterns may include copper (Cu), titanium (Ti), and/or an alloy thereof. The seed patterns function as a barrier layer and may reduce, or prevent, diffusion of a material included in the second redistribution patterns 320.

The second redistribution patterns 320 may include third wiring patterns 321, fourth wiring patterns 322, and/or second redistribution pads 323. The third wiring patterns 321 may be wiring patterns that are electrically connected to the second semiconductor chip 500 to be described later and constitute a signal circuit of the semiconductor chip. The third wiring patterns 321 may be electrically connected to the through electrodes 250. The fourth wiring patterns 322 may be connected to the dummy patterns 220. The fourth wiring patterns 322 may be electrically floating with the third wiring patterns 321 in the second redistribution substrate 300. That is, the third wiring patterns 321 may be electrically insulated from the fourth wiring patterns 322.

The third wiring patterns 321 and the fourth wiring patterns 322 may not be directly connected to each other. Among the fourth wiring patterns 322, the uppermost fourth wiring patterns 322 may be exposed on an upper surface of the second redistribution substrate 300.

The second redistribution pads 323 may be a portion of the second redistribution patterns 320 disposed on the upper surface of the second redistribution substrate 300. For example, the second redistribution pads 323 may be second redistribution patterns 320 exposed on the upper surface of the second redistribution substrate 300. The second redistribution pads 323 may be connected to the third wiring patterns 321 disposed thereunder.

The second semiconductor chip 500 may be disposed on the second redistribution substrate 300. The second semiconductor chip 500 may be, for example, a logic chip and/or a buffer chip. The logic chip may include an ASIC chip and/or an application processor (AP) chip. Alternatively, the logic chip may include a central processing unit (CPU) and/or a graphics processing unit (GPU). The ASIC chip may include an application specific integrated circuit (ASIC). As another example, the second semiconductor chip 500 may be a memory chip.

The second semiconductor chip 500 may include second chip pads 501 provided on a lower surface of the second semiconductor chip 500. The second chip pads 501 may be exposed on the lower surface of the second semiconductor chip 500. The second chip pads 501 may include a metal. The second chip pads 501 may include, for example, copper (Cu).

A second chip passivation layer 502 may be provided on the lower surface of the second semiconductor chip 500. The second chip passivation layer 502 may surround the second chip pads 501. The second chip pads 501 may be exposed by the second chip passivation layer 502. A lower surface of the second chip passivation layer 502 may be coplanar with a lower surface of the second chip pads 501. The second chip passivation layer 502 may include an insulating material such as silicon oxide (SiO), silicon nitride (SiN), and/or silicon carbon nitride (SiCN).

The second semiconductor chip 500 may be disposed on the second redistribution substrate 300 in a face down manner. For example, the second semiconductor chip 500 may have a front surface facing the second redistribution substrate 300 and a rear surface opposite to the front surface. That is, the lower surface of the second semiconductor chip 500 on which the second chip pads 501 are disposed may correspond to the front surface, and the upper surface of the second semiconductor chip 500 may correspond to the rear surface. For example, the front surface of the second semiconductor chip 500 may face the second redistribution substrate 300.

First chip connection terminals 330 may be disposed between the second semiconductor chip 500 and the second redistribution substrate 300. Each, or one or more, of the first chip connection terminals 330 may be disposed to correspond to the second redistribution pads 323 and/or the second chip pads 501. Accordingly, the second semiconductor chip 500 may be electrically connected to the third wiring patterns 321 of the second redistribution substrate 300 through the first chip connection terminals 330. Unlike the drawing, the second semiconductor chip 500 may be electrically connected to the third wiring patterns 321 of the second redistribution substrate 300 through inter-metal hybrid bonding of the second redistribution pads 323 and the second chip pads 501. The first chip connection terminals 330 may include a metal. The first chip connection terminals 330 may include, for example, copper (Cu).

Figure 3A:
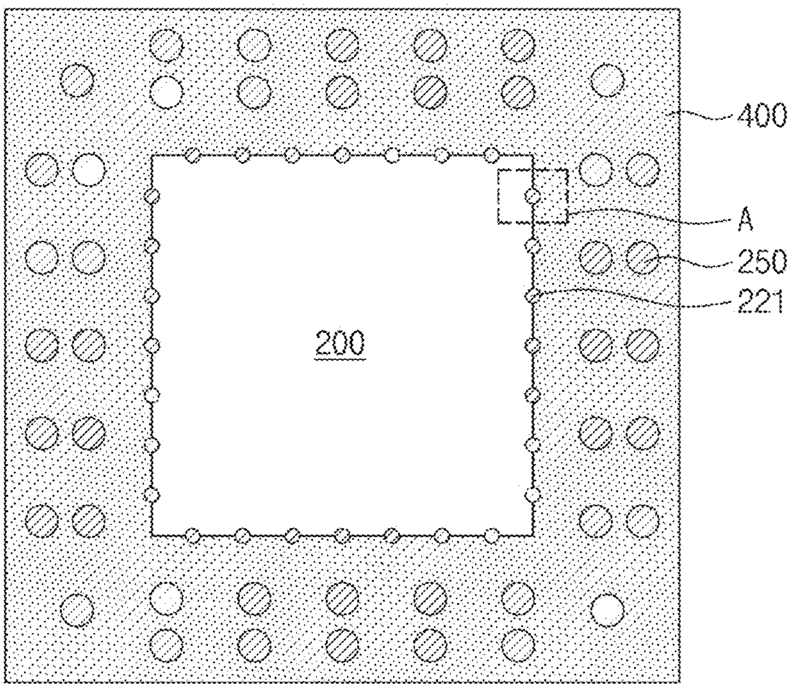
FIG. 3A is a plan view of a semiconductor package according to some example embodiments of the inventive concepts.
Figure 3B:
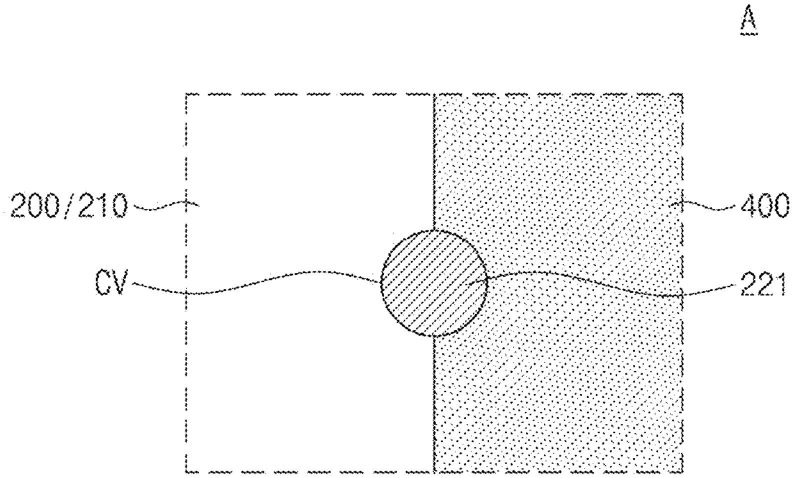
FIG. 3B is an enlarged view of a section A of FIG. 3A.

FIG. 3A is a plan view of a semiconductor package according to some example embodiments of the inventive concepts. FIG. 3B is an enlarged view of a section A of FIG. 3A. Hereinafter, contents overlapping with those described above will be omitted, and differences from those of FIG. 2 will be described.

Referring to FIGS. 1, 3A, and 3B, a semiconductor package 10 may include a first redistribution substrate 100, a first semiconductor chip 200, a heat dissipation layer 210, dummy patterns 220, a through electrode 250, a second redistribution substrate 300, a molding layer 400, and/or a second semiconductor chip 500.

A chip structure may be disposed on the first redistribution substrate 100. The chip structure may include a first semiconductor chip 200 and a heat dissipation layer 210 in contact with an upper surface of the first semiconductor chip 200. A side surface of the chip structure may include a concave portion CV toward an inside of the chip structure. That is, the side surface of the first semiconductor chip 200 and/or the side surface of the heat dissipation layer 210 may have the concave portion CV toward the inside of the first semiconductor chip 200 and the heat dissipation layer 210. The concave portion CV may be depressed toward the inside of the first semiconductor chip 200 and the heat dissipation layer 210 from the side surface of the first semiconductor chip 200 and the side surface of the heat dissipation layer 210. For example, the concave portion CV may be a semicircle or a polygon when viewed in a plan view.

Dummy patterns 221 may be provided on the first redistribution substrate 100. The dummy patterns 221 may be spaced apart from each other on the first redistribution substrate 100. The dummy patterns 221 may surround the first semiconductor chip 200 and the heat dissipation layer 210. The dummy patterns 221 may be in contact with the side surface of the first semiconductor chip 200 and the side surface of the heat dissipation layer 210. At least a portion of the side surface of the dummy patterns 221 may be in contact with the concave portion CV. Other portions of the side surfaces of the dummy patterns 221 may be in contact with the molding layer 400.

The semiconductor package 10 according to some example embodiments includes a heat dissipation layer 210 in direct contact with the first semiconductor chip 200, and/or dummy patterns 220 directly connected to the heat dissipation layer 210. In addition, the dummy patterns 220 are connected to the wiring patterns 122 and/or 322 and are electrically insulated from the wiring patterns 121, 123*a*, 123*b*, 321, and/or 323 constituting signal circuits of the first semiconductor chip 200 and/or the second semiconductor chip 500 in the first and/or second redistribution substrates 100 and/or 300. Accordingly, heat generated in the first semiconductor chip 200 may be dissipated to the outside through the second wiring patterns 122 and/or the second board connection terminal 150 connected to the heat dissipation layer 210 and/or the dummy patterns 220. In addition, the heat generated in the first semiconductor chip 200 may be dissipated to the outside through the fourth wiring patterns 322 connected to the dummy patterns 220. Accordingly, the heat dissipation layer 210 and/or the dummy patterns 220 may facilitate dissipation of the heat generated from the first semiconductor chip 200 and improve thermal stability of the semiconductor package 10.

Figure 4:
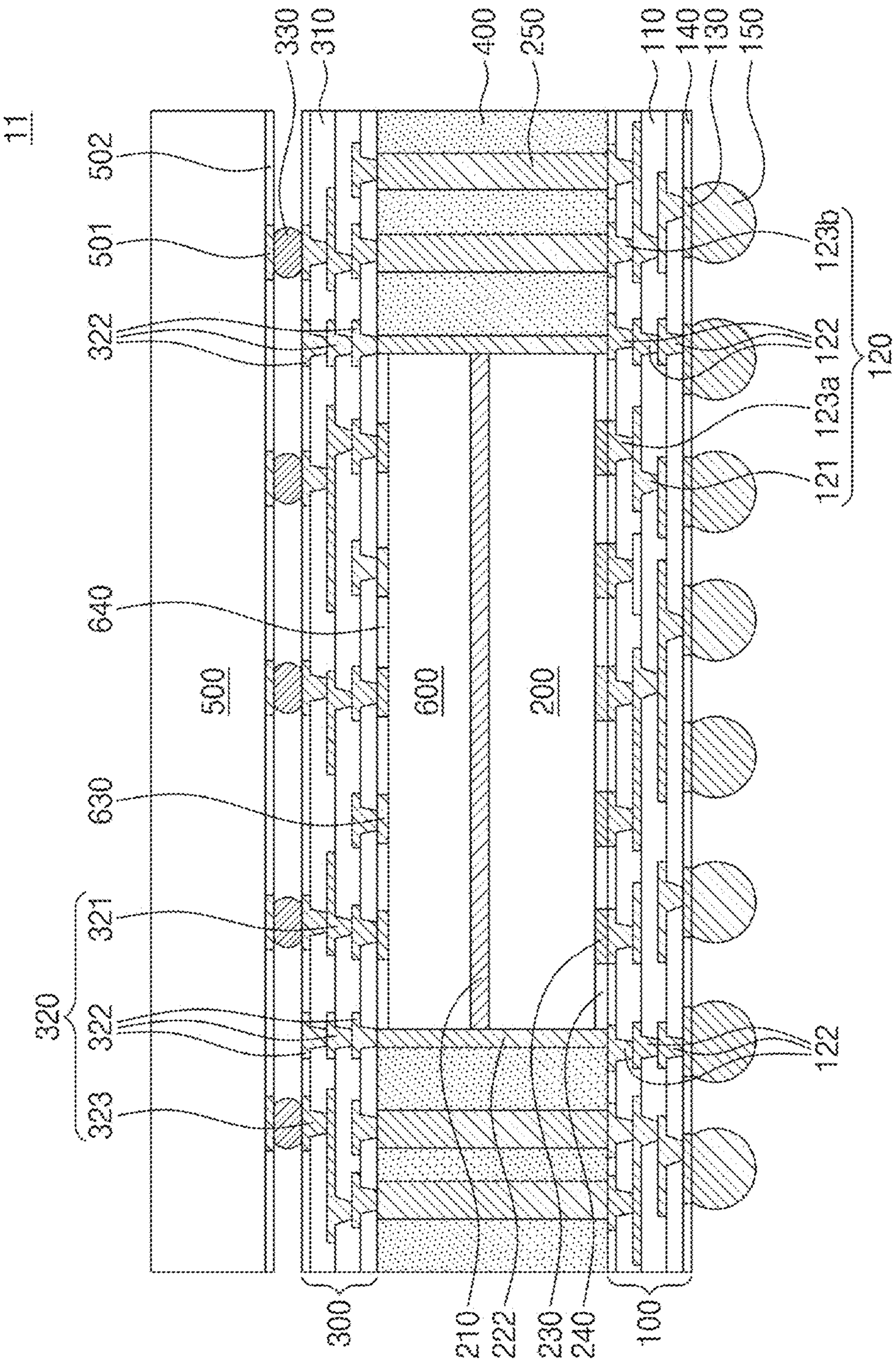
FIG. 4 is a cross-sectional view of a semiconductor package according to some example embodiments of the inventive concepts.

FIG. 4 is a cross-sectional view of a semiconductor package according to some example embodiments of the inventive concept. Hereinafter, contents overlapping with those described above will be omitted, and for convenience of description, the same reference numerals may be provided to the same configuration as that described with reference to FIG. 1.

Referring to FIG. 4, a semiconductor package 11 may include a first redistribution substrate 100, a first semiconductor chip 200, a heat dissipation layer 210, dummy patterns 222, a through electrode 250, a second redistribution substrate 300, a molding layer 400, a second semiconductor chip 500, and/or a third semiconductor chip 600.

A third semiconductor chip 600 may be provided between the first semiconductor chip 200 and the second redistribution substrate 300 on the first redistribution substrate 100. The third semiconductor chip 600 may be, for example, a logic chip and/or a buffer chip. The logic chip may include an ASIC chip and/or an application processor (AP) chip. Alternatively, the logic chip may include a central processing unit (CPU) and/or a graphics processing unit (GPU). The ASIC chip may include an application specific integrated circuit (ASIC). As another example, the third semiconductor chip 600 may be a memory chip.

The third semiconductor chip 600 may include third chip pads 630 provided on an upper surface of the third semiconductor chip 600. The third chip pads 630 may be exposed on the upper surface of the third semiconductor chip 600. The third chip pads 630 may include a metal. The third chip pads 630 may include, for example, copper (Cu).

A third chip passivation layer 640 may be provided on the upper surface of the third semiconductor chip 600. The third chip passivation layer 640 may surround the third chip pads 630. The third chip pads 630 may be exposed by the third chip passivation layer 640. A lower surface of the third chip passivation layer 640 may be coplanar with upper surfaces of the third chip pads 630. The third chip passivation layer 640 may include an insulating material such as silicon oxide (SiO), silicon nitride (SiN), and/or silicon carbon nitride (SiCN).

The third semiconductor chip 600 may be disposed on the first semiconductor chip 200 in a face up manner. For example, the third semiconductor chip 600 may have a front surface facing the second redistribution substrate 300 and a rear surface facing the front surface. That is, the upper surface of the third semiconductor chip 600 on which the third chip pads 630 are disposed may correspond to the front surface, and the lower surface of the third semiconductor chip 600 may correspond to the rear surface. For example, the third semiconductor chip 600 may be disposed so that the front side thereof faces the second redistribution substrate 300.

The third semiconductor chip 600 may be connected to the second redistribution substrate 300. In detail, the third chip pads 630 of the third semiconductor chip 600 may be electrically connected to the third wiring patterns 321 exposed on the lower surface of the second redistribution substrate 300. For example, the third wiring patterns 321 and/or the third chip pads 630 may be in contact with each other to form an integral body, at an interface between the lowermost insulating layer 310 of the second redistribution substrate 300 and the third chip passivation layer 640.

The heat dissipation layer 210 may be interposed between the first semiconductor chip 200 and the third semiconductor chip 600. A lower surface of the heat dissipation layer 210 may be in contact with an upper surface of the first semiconductor chip 200. An upper surface of the heat dissipation layer 210 may be in contact with a lower surface of the third semiconductor chip 600. That is, the heat dissipation layer 210 may be in contact with rear surfaces of each, or one or more, of the first semiconductor chip 200 and/or the third semiconductor chip 600. A side surface of the heat dissipation layer 210, a side surface of the first semiconductor chip 200, and/or a side surface of the third semiconductor chip 600 may be vertically aligned. The heat dissipation layer 210 may include a metal. The heat dissipation layer 210 may include, for example, copper (Cu).

The dummy patterns 222 may be provided on the first redistribution substrate 100. The dummy patterns 222 may surround the first semiconductor chip 200, the third semiconductor chip 600, and/or the heat dissipation layer 210. The dummy patterns 222 may be in contact with side surfaces of the first semiconductor chip 200, the third semiconductor chip 600, and/or the heat dissipation layer 210. A upper surface of the dummy patterns 222 may be coplanar with the upper surface of the third semiconductor chip 600. However, the inventive concepts are not limited thereto, and the upper surfaces of the dummy patterns 222 may be positioned at a higher vertical level than the upper surfaces of the third semiconductor chip. In this case, the molding layer 400 may cover the upper surface of the third semiconductor chip 600, and the third wiring patterns 321 of the second redistribution substrate 300 may pass through the molding layer 400 and be connected to the third chip pads 630 on the upper surface of the third semiconductor chip 600. The dummy patterns 220 may vertically pass through the molding layer 400 and may be connected to the second wiring patterns 122 of the first redistribution substrate 100 and the fourth wiring patterns 322 of the second redistribution substrate 300. The dummy patterns 222 may include a metal. The dummy patterns 222 may include, for example, copper (Cu).

Figure 5:
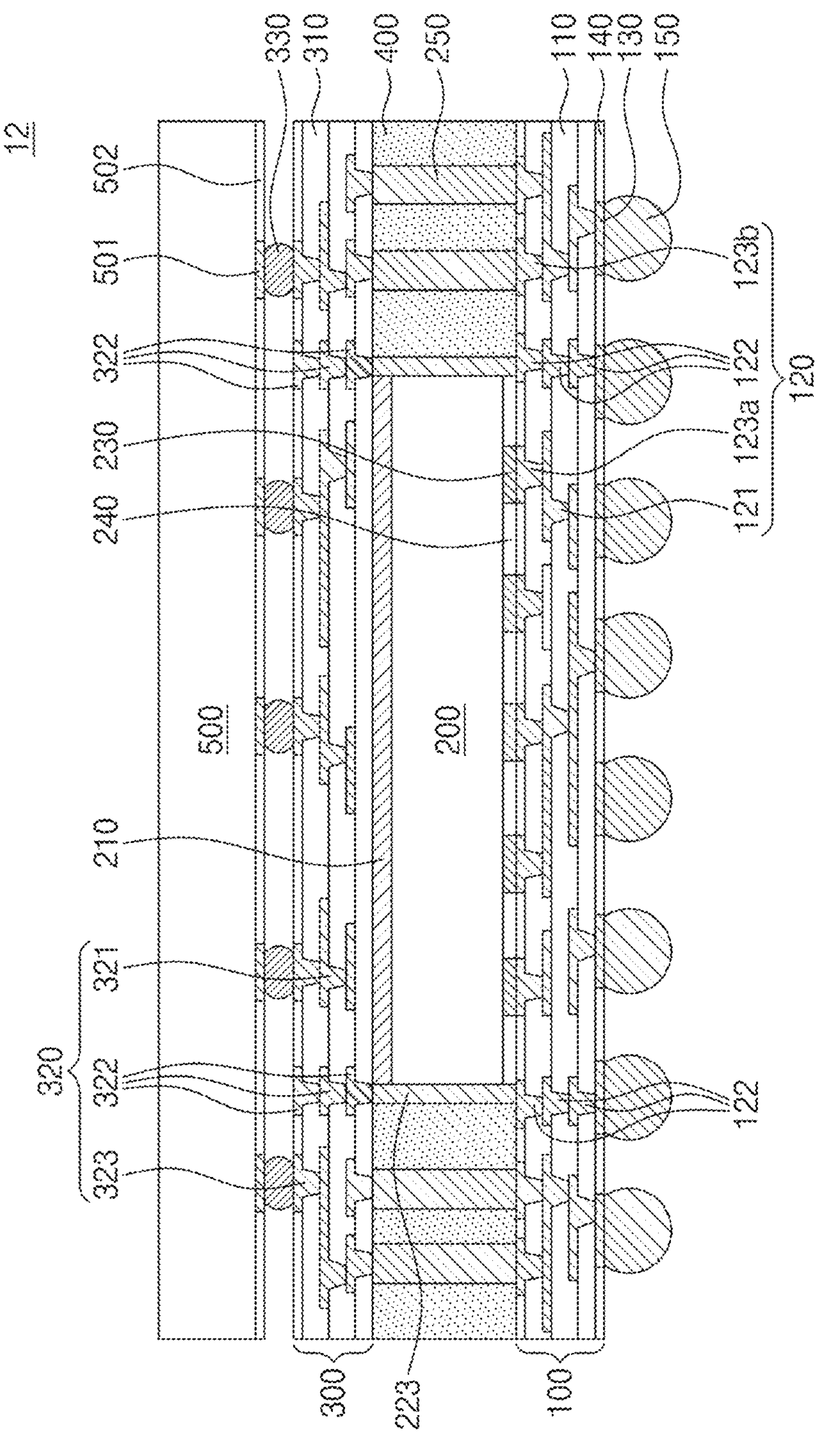
FIG. 5 is a cross-sectional view of a semiconductor package according to some example embodiments of the inventive concepts.

FIG. 5 is a cross-sectional view of a semiconductor package according to some example embodiments of the inventive concepts. Hereinafter, contents overlapping with those described above will be omitted, and for convenience of description, the same reference numerals may be provided to the same configuration as the configuration described with reference to FIG. 1.

Referring to FIG. 5, a semiconductor package 12 may include a first redistribution substrate 100, a first semiconductor chip 200, a heat dissipation layer 210, dummy patterns 223, a through electrode 250, a second redistribution substrate 300, a molding layer 400, and/or a second semiconductor chip 500.

The second redistribution substrate 300 may be provided on the heat dissipation layer 210. The heat dissipation layer 210 may be interposed between the first semiconductor chip 200 and the second redistribution substrate 300. A lower surface of the heat dissipation layer 210 may be in contact with an upper surface of the first semiconductor chip 200. The upper surface of the heat dissipation layer 210 may be in contact with the lower surface of the second redistribution substrate 300, but the heat dissipation layer 210 may not be in direct contact with the third wiring patterns 321 of the second redistribution substrate 300. The upper surface of the heat dissipation layer 210 may be coplanar with the upper surfaces of the through electrode 250 and the molding layer 400. The heat dissipation layer 210 may include a metal. The heat dissipation layer 210 may include, for example, copper (Cu).

The dummy patterns 223 may be provided on the first redistribution substrate 100. The dummy patterns 223 may surround the first semiconductor chip 200 and/or the heat dissipation layer 210. The dummy patterns 223 may be in contact with side surfaces of the first semiconductor chip 200 and/or the heat dissipation layer 210. Upper surfaces of the dummy patterns 222 may be coplanar with the upper surfaces of the molding layer 400 and/or the heat dissipation layer 210. The dummy patterns 223 may vertically pass through the molding layer 400 and/or may be connected to the second wiring patterns 122 of the first redistribution substrate 100 and the fourth wiring patterns 322 of the second redistribution substrate 300. The dummy patterns 223 may include a metal. The dummy patterns 223 may include, for example, copper (Cu).

Figure 6:
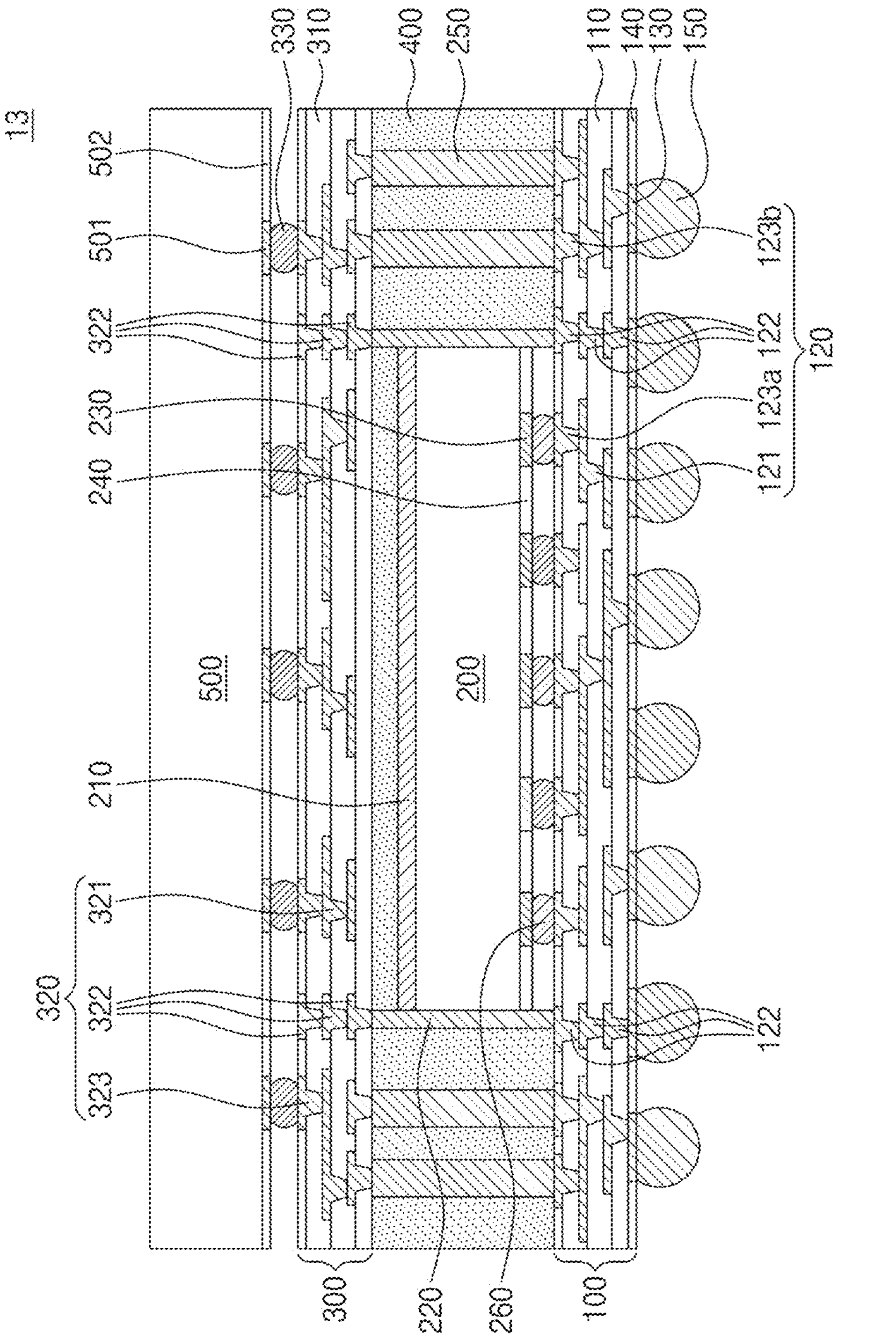
FIG. 6 is a cross-sectional view of a semiconductor package according to some example embodiments of the inventive concepts

FIG. 6 is a cross-sectional view of a semiconductor package according to some example embodiments of the inventive concepts. Hereinafter, contents overlapping with those described above will be omitted, and for convenience of description, the same reference numerals may be provided to the same configuration as the configuration described with reference to FIG. 1.

Referring to FIG. 6, a semiconductor package 13 may include a first redistribution substrate 100, a first semiconductor chip 200, a heat dissipation layer 210, dummy patterns 220, a through electrode 250, a second redistribution substrate 300, a molding layer 400, and/or a second semiconductor chip 500.

A first semiconductor chip 200 may be provided on the first redistribution substrate 100. The first semiconductor chip 200 may be disposed on the first redistribution substrate 100 in a face down manner. The first semiconductor chip 200 may be mounted on the first redistribution substrate 100 in a flip chip manner. For example, second chip connection terminals 260 may be provided between the first semiconductor chip 200 and the first redistribution substrate 100. The second chip connection terminals 260 may be disposed to correspond to the first chip pads 230 of the first semiconductor chip 200 and/or the first redistribution pads **123*a* of the first redistribution substrate 100. Accordingly, the first semiconductor chip 200 may be electrically connected to the first wiring patterns 121 of the first redistribution substrate 100 through the second chip connection terminals 260**.

The molding layer 400 may be provided on the first redistribution substrate 100. The molding layer 400 may surround the first semiconductor chip 200, the heat dissipation layer 210, the dummy patterns 220, and/or the through electrodes 250 on the first redistribution substrate 100. The molding layer 400 may fill a space between the heat dissipation layer 210 and the second redistribution substrate 300. The molding layer 400 may surround the second chip connection terminals 260 between the first redistribution substrate 100 and the first semiconductor chip 200. A side surface of the molding layer 400 may be vertically aligned with the first redistribution substrate 100. The molding layer 400 may include an insulating polymer such as an epoxy-based molding compound (EMC).

Figure 7:
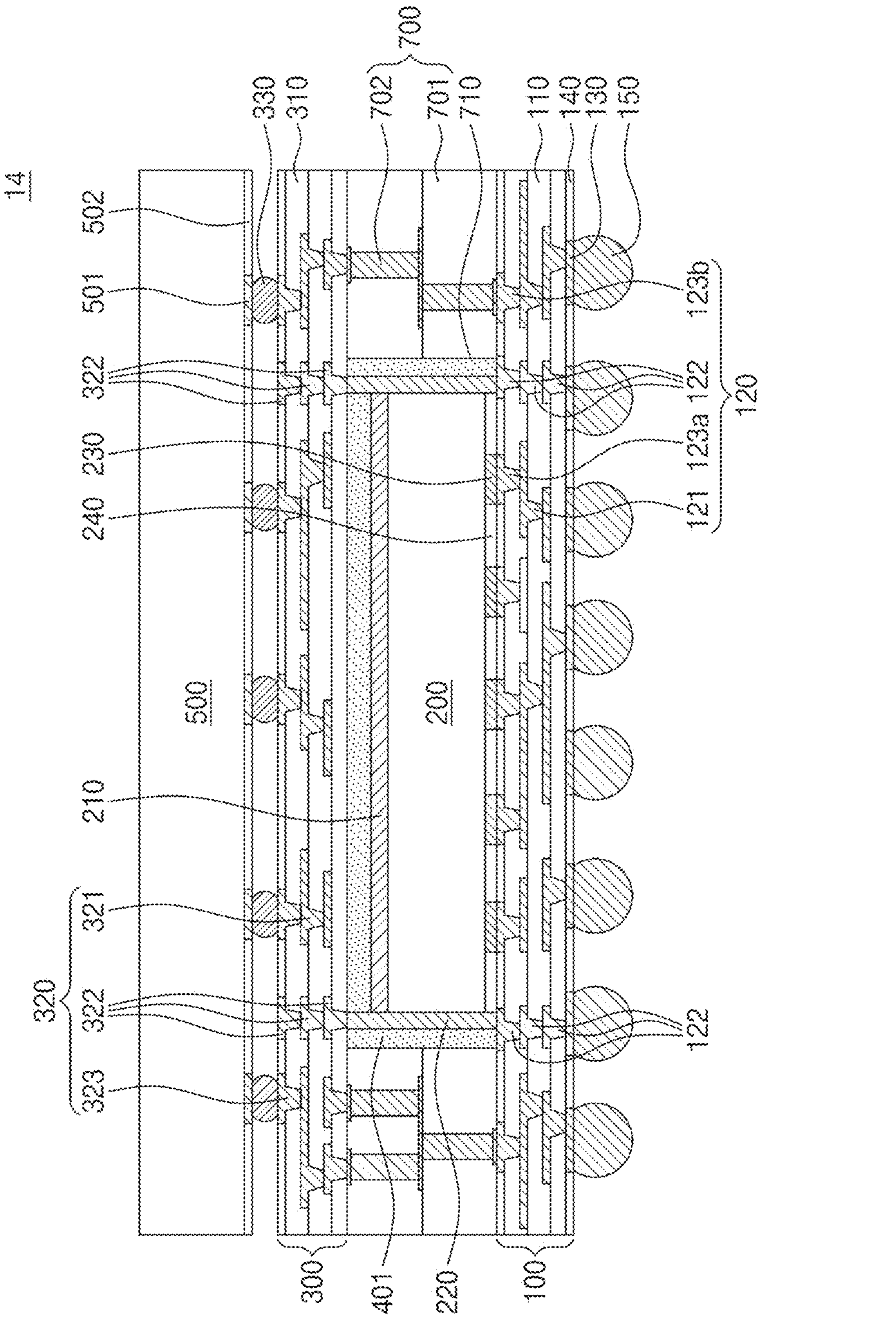
FIG. 7 is a cross-sectional view of a semiconductor package according to some example embodiments of the inventive concepts.

FIG. 7 is a cross-sectional view of a semiconductor package according to some example embodiments of the inventive concepts. Hereinafter, contents overlapping with those described above will be omitted, and for convenience of description, the same reference numerals may be provided to the same configuration as the configuration described with reference to FIG. 1.

Referring to FIG. 7, a semiconductor package 14 may include a first redistribution substrate 100, a first semiconductor chip 200, a heat dissipation layer 210, dummy patterns 220, a second redistribution substrate 300, a molding layer 401, a connection substrate 700, and/or a second semiconductor chip 500.

The connection substrate 700 may be disposed on the first redistribution substrate 100. The connection substrate 700 may have a connection substrate opening 710 passing through the connection substrate 700. The connection substrate opening 710 may have an open hole shape connecting upper and lower surfaces of the connection substrate 700. The lower surface of the connection substrate 700 may be in contact with the upper surface of the first redistribution substrate 100. The upper surface of the connection substrate 700 may be in contact with a lower surface of the second redistribution substrate 300. The connection substrate 700 may include an insulating pattern 701 and/or conductive patterns 702. The conductive patterns 702 may be spaced apart from the connection substrate opening 710. The conductive patterns 702 may be disposed outside the connection substrate opening 710. The outer side of the connection substrate opening 710 may be an area between the connection substrate opening 710 and a side surface of the first redistribution substrate 100. The conductive patterns 702 may vertically pass through the insulating pattern 701. The conductive patterns 702 may vertically pass through the insulating pattern 701 and be electrically connected to the first redistribution pad **123*b* of the first redistribution substrate 100 and/or the first wiring patterns 121. The first semiconductor chip 200, the heat dissipation layer 210 and/or the dummy patterns 220 may be provided in the connection substrate opening 510**.

The molding layer 401 may be provided in the connection substrate opening 710 on the first redistribution substrate 100. The molding layer 401 may surround the first semiconductor chip 200, the heat dissipation layer 210, and/or the dummy patterns 220. The molding layer 401 may be provided between the heat dissipation layer 210 and the second redistribution substrate 300. A lower surface of the molding layer 401 may be in contact with an upper surface of the first redistribution substrate 100.

The second redistribution substrate 300 may be provided on the connection substrate 700. The connection substrate 700 may be a connection structure electrically connecting the first redistribution substrate 100 and the second redistribution substrate 300. The conductive patterns 702 may be electrically connected to the third wiring patterns 321 and/or the second redistribution pads 323 of the second redistribution substrate 300. The first wiring patterns 121 of the first redistribution substrate 100 and the third wiring patterns 321 of the second redistribution substrate 300 may be electrically connected through the conductive patterns 702.

FIGS. 8 to 19 are cross-sectional views illustrating a method of manufacturing a semiconductor package according to some example embodiments of the inventive concepts.

Figure 8:
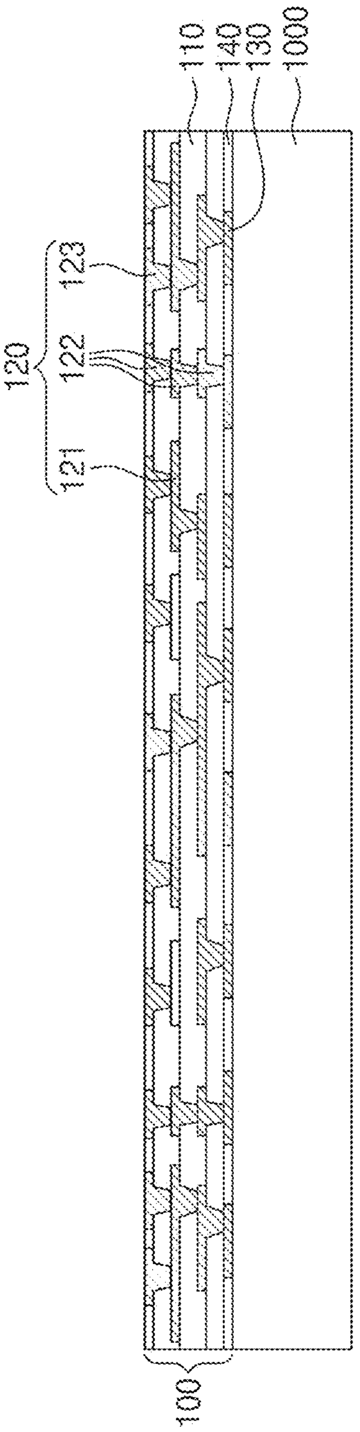
FIGS. 8 to 19 are cross-sectional views illustrating a method of manufacturing a semiconductor package according to some example embodiments of the inventive concepts.

Referring to FIG. 8, a carrier substrate 1000 may be provided. The carrier substrate 1000 may be an insulating substrate formed of glass and/or polymer, and/or a conductive substrate made of metal. Although not shown, an adhesive member may be provided on an upper surface of the carrier substrate 1000. For example, the adhesive member may include an adhesive tape.

Substrate pads 130 may be formed on the carrier substrate 1000. The substrate pads 130 may be formed by an electroplating process. For example, after a substrate protection layer 140 is formed on the carrier substrate 1000, openings defining regions where the substrate pads 130 are formed may be formed in the substrate protection layer 140. Then, the electroplating process may be performed to fill the openings with a conductive material. The substrate protection layer 140 may surround the substrate pads 130. The substrate protection layer 140 may expose upper surfaces of the substrate pads 130.

A first insulating layer 110 may be formed on the substrate protection layer 140. For example, the first insulating layer 110 may be formed by coating an insulating material on the substrate protection layer 140. The insulating material may include, for example, an organic material such as a photo-imageable dielectric (PID) material. The photo-imageable dielectric material may be a polymer. The photo-imageable dielectric material may include, for example, at least one of photosensitive polyimide, polybenzoxazole, phenol-based polymer, and/or benzocyclobutene-based polymer.

Openings may be formed by patterning the first insulating layer 110. A metal layer may be formed to fill the openings of the first insulating layer 110 and cover the first insulating layer 110. First redistribution patterns 120 may be formed in the first insulating layer 110 through the planarization process of the metal layer. The planarization process may be performed by, for example, a chemical mechanical polishing (CMP) process. The planarization process may be performed until an upper surface of the first insulating layer 110 is exposed. The first redistribution patterns 120 may include first wiring patterns 121, second wiring patterns 122, and first redistribution pads 123. The first wiring patterns 121 and/or the first redistribution pads 123 of the first redistribution patterns 120 may not be in direct contact with the second wiring patterns 122.

Although not shown, seed patterns may be formed conformally on the upper surface of the first insulating layer 110 and in the openings of the first insulating layer 110 before the first redistribution patterns 120 are formed. An electroplating process using the seed patterns as electrodes may be performed to form the first redistribution patterns 120. The first redistribution patterns 120 may be formed on the upper surface of the first insulating layer 110 and in the openings to cover the seed patterns. Each, or one or more, of the first redistribution patterns 120 may include a first via portion and/or a first wiring portion. The first via portion may be formed in the corresponding openings of the first insulating layer 110. The first wiring portion may be formed on the first via portion and may extend onto the upper surface of the first insulating layer 110.

Forming the first insulating layer 110, forming the seed patterns, and/or forming the first redistribution patterns 120 may be repeatedly performed. Accordingly, the stacked first insulating layer 110 and/or the stacked first redistribution patterns 120 may constitute a first redistribution substrate 100.

Figure 9:
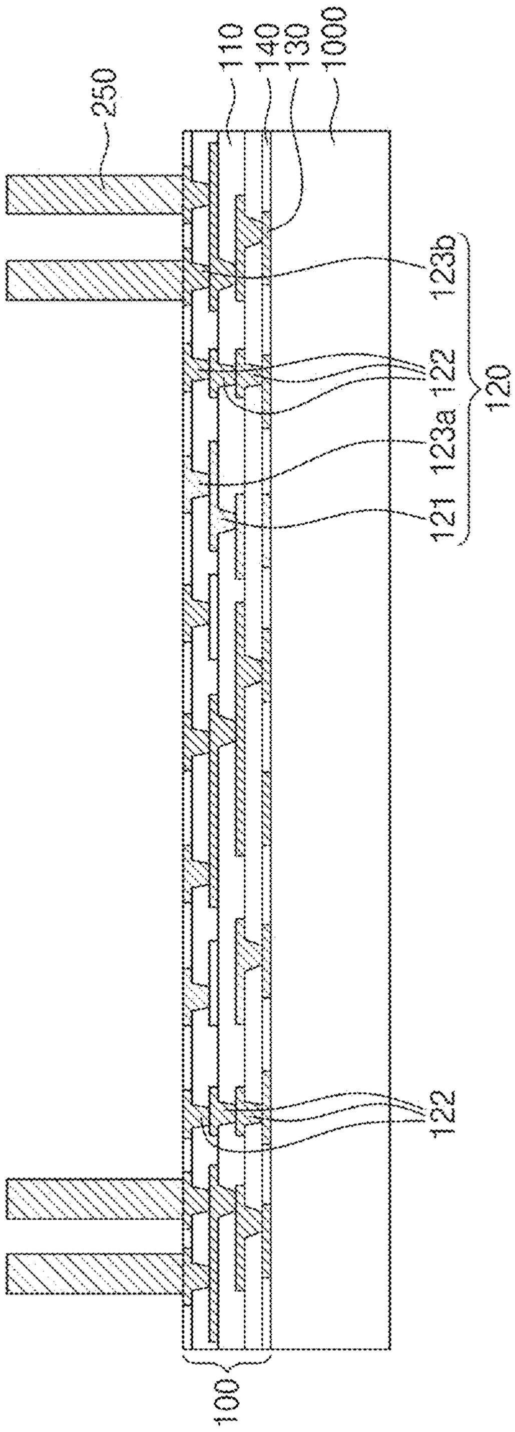

Referring to FIG. 9, through electrodes 250 may be formed on the first redistribution pads **123*b*. Although not shown, after forming a sacrificial layer on the first redistribution substrate 100, a through hole is formed in the sacrificial layer to expose the first redistribution pads 123*b*, and a conductive material covers the through hole. An electroplating process may be performed to fill the through hole. The through electrodes 250 may be formed to extend from upper surfaces of the first redistribution pads 123*b* in a direction perpendicular to the first redistribution substrate 100. Each, or one or more, of the through electrodes 250 may be formed in a cylindrical shape. However, a shape of the through electrodes 250** may be variously modified and may be formed in a polygonal column shape.

Figure 10:
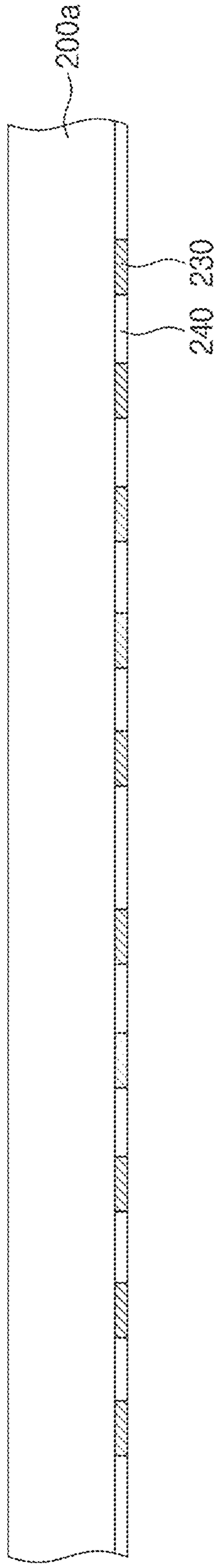

Referring to FIG. 10, a wafer **200*a* for forming a semiconductor chip may be provided. Although not shown, a circuit layer may be formed on the wafer 200*a*. The circuit layer may be a memory circuit including one or more transistors, a logic circuit, and/or a combination thereof. Alternatively, the circuit layer may include a passive element such as a resistance element and/or a capacitor. A first chip passivation layer 240 may be formed on a lower surface of the wafer 200*a* to cover the circuit layer. Openings may be formed by performing a patterning process on the first chip passivation layer 240. Although not shown, a metal layer filling the openings of the first chip passivation layer 240 may be formed. First chip pads 230 may be formed in the first chip passivation layer 240 through a planarization process of the metal layer. The planarization process may be performed until the lower surface of the first chip passivation layer 240** is exposed.

Figure 11:
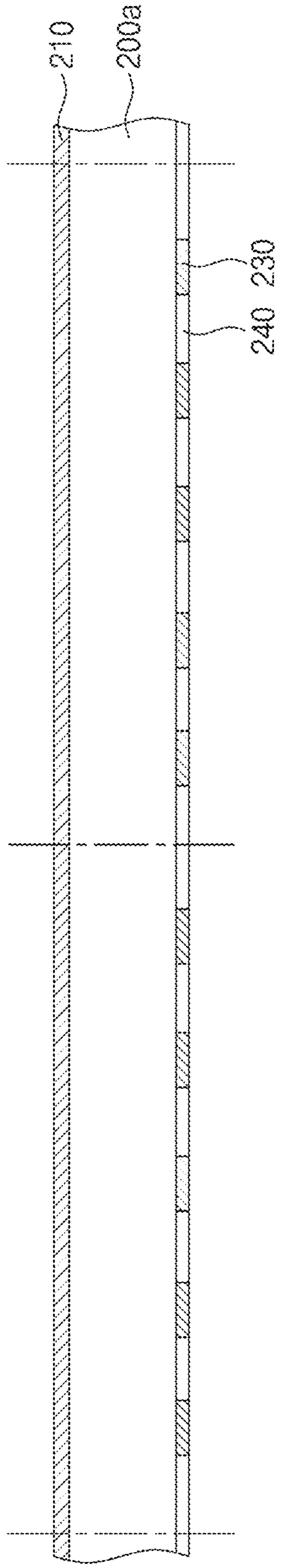
Figure 12:
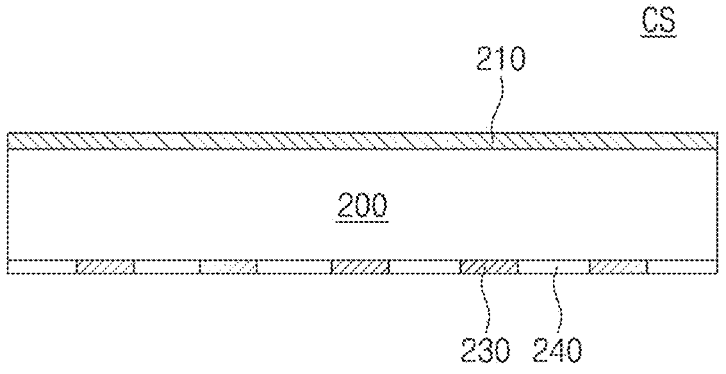

Referring to FIGS. 11 and 12, a heat dissipation layer 210 may be formed on the wafer **200*a*. The heat dissipation layer 210 may be formed to cover an upper surface of the wafer 200*a*. The heat dissipation layer 210 may be formed through an electroplating process. The heat dissipation layer 210 may include a metal. For example, the heat dissipation layer 210 may include copper (Cu). A single chip structure CS including the heat dissipation layer 210 and a first semiconductor chip 200 may be formed through a process of cutting the wafer 200*a* on which the heat dissipation layer 210** is formed.

Figure 13:
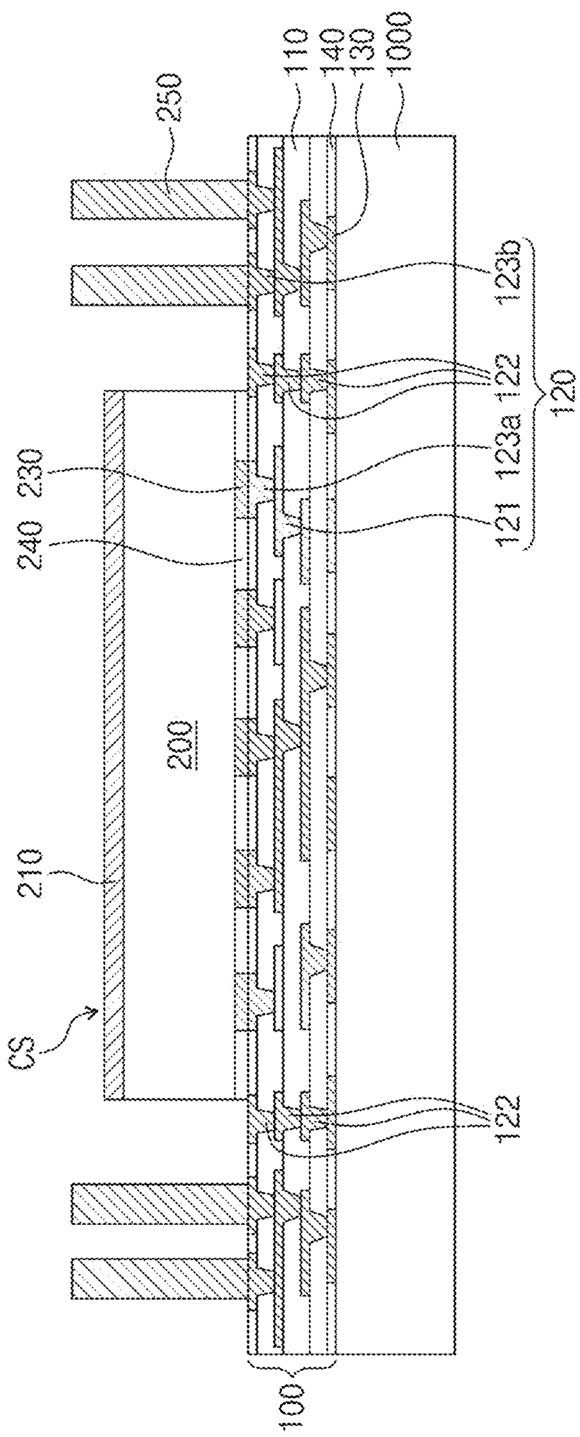

Referring to FIG. 13, the chip structure CS may be mounted on the first redistribution substrate 100. The chip structure CS may be disposed inside the through electrodes 250 on the first redistribution substrate 100. In the chip structure CS, the first chip pads 230 of the first semiconductor chip 200 may face down toward the first redistribution substrate 100. In detail, the first chip passivation layer 240 of the first semiconductor chip 200 and the first insulating layer 110 at the uppermost portion of the first redistribution substrate 100 may be disposed to be in contact with each other. In this case, the first chip pads 230 of the first semiconductor chip 200 and the first redistribution pads **123*a* of the first redistribution substrate 100 may be in contact with each other at an interface between the first chip passivation layer 240 and the uppermost first insulating layer 110. The first chip pads 230 and the first redistribution pads 123*a* may be connected to each other through metal-to-metal hybrid bonding. For example, the first chip pads 230 and the first redistribution pads 123*a* may be formed of the same material (e.g., copper (Cu)), and the first chip pads 230 and the first redistribution pads 123*a* may be coupled at the interface between first chip pads 230 and the first redistribution pads 123*a* in contact with each other, by an intermetallic hybrid bonding process by surface activation. The first chip pads 230 and the first redistribution pads 123*a* bonded to each other may have a continuous configuration. The first chip pads 230 and the first redistribution pads 123*a* may be formed of the same material, and thus an interface therebetween may not be visually distinguished. That is, the first chip pads 230 and the first redistribution pads 123*a*** may be provided as one component.

Figure 14:
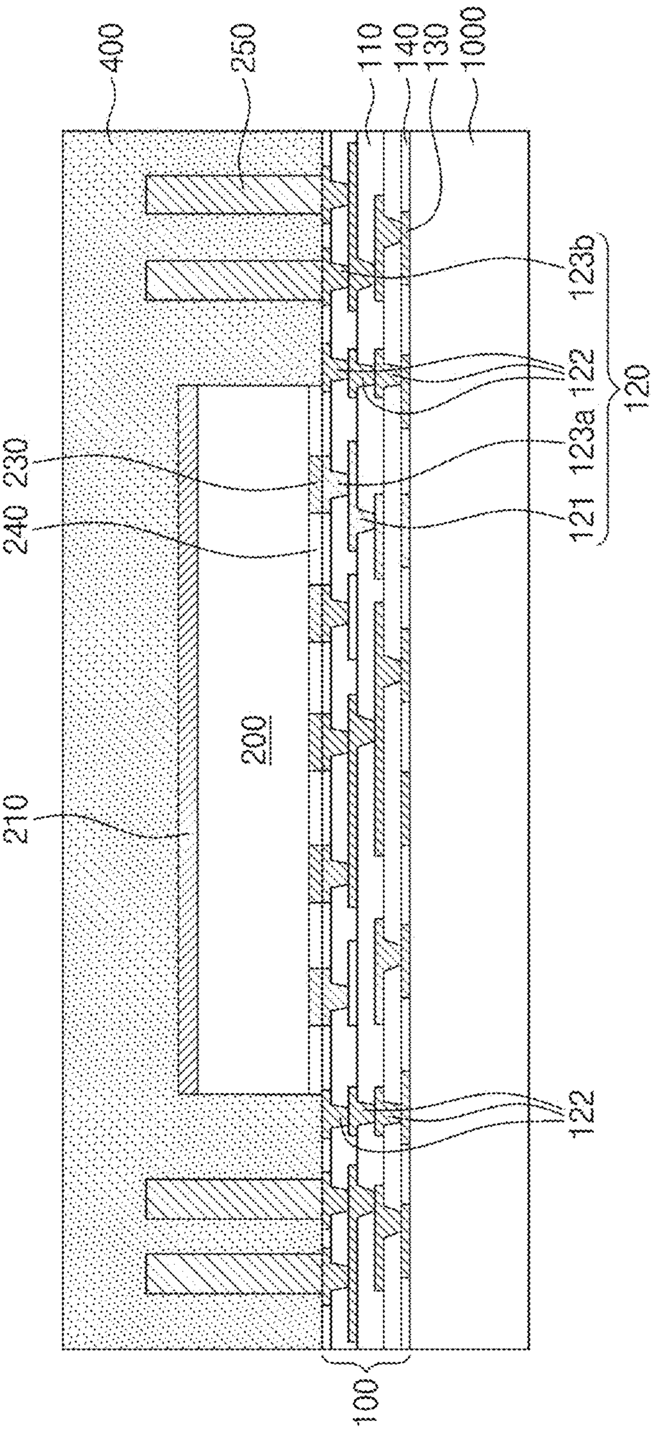

Referring to FIG. 14, a molding layer 400 may be formed on the first redistribution substrate 100. The molding layer 400 may be formed to cover upper surfaces of the first redistribution substrate 100, the first semiconductor chip 200, the heat dissipation layer 210, and/or the through electrodes 250. For example, an insulating material may be applied to bury the first semiconductor chip 200, the heat dissipation layer 210, and/or the through electrodes 250 on the first redistribution substrate 100. The insulating material may include an insulating polymer such as an epoxy-based molding compound (EMC).

Figure 15:
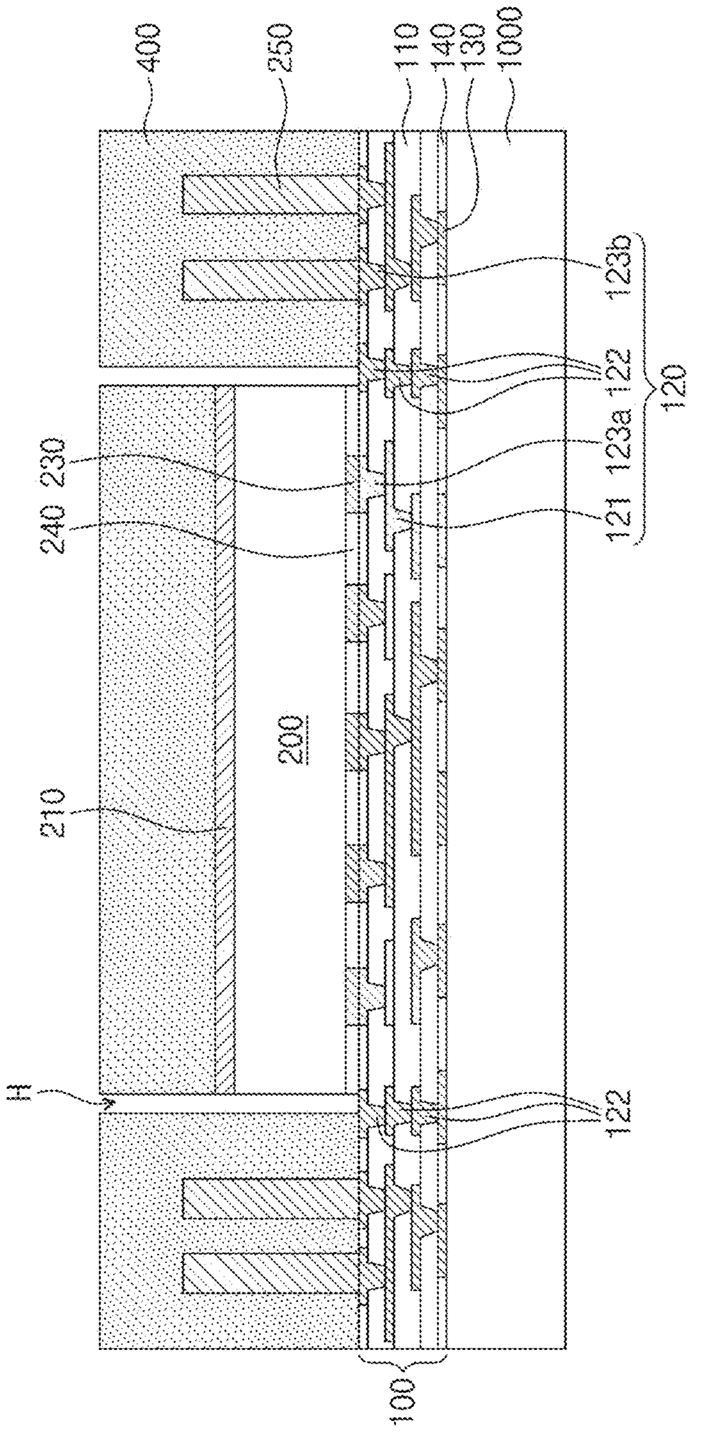
Figure 16:
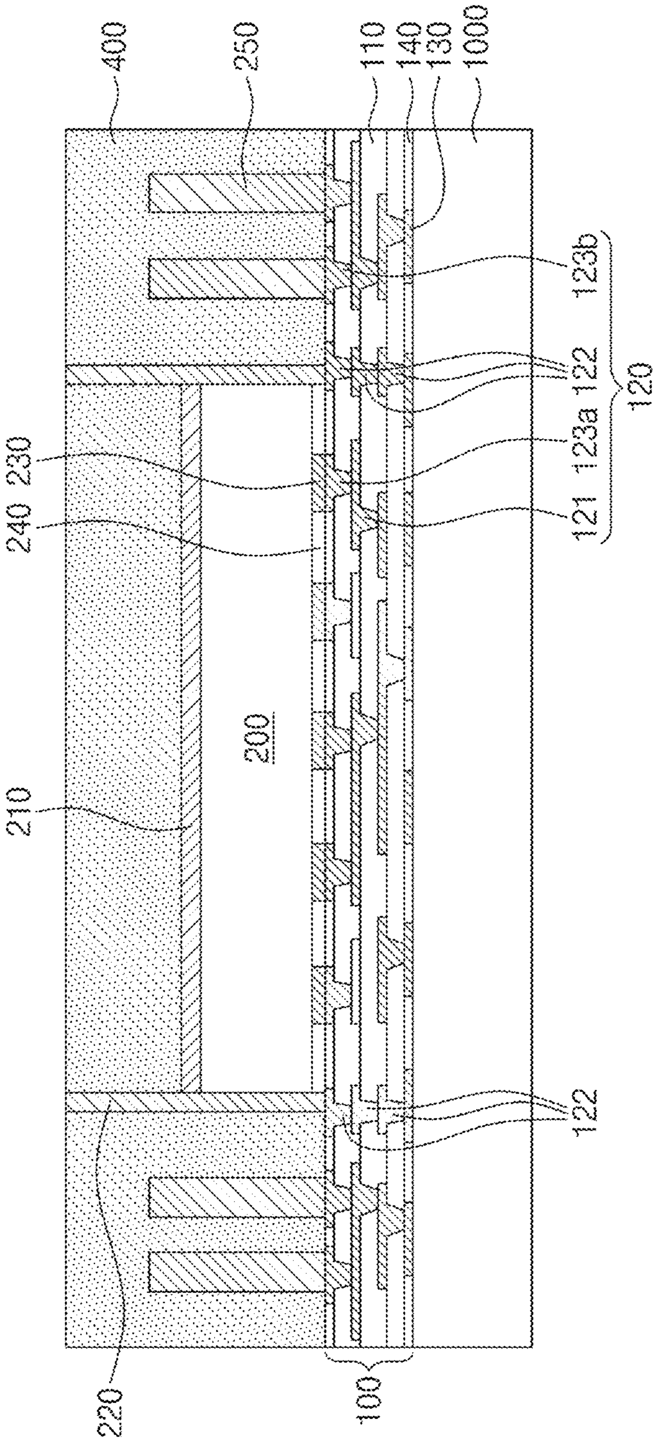

Referring to FIGS. 15 and 16, a hole H vertically penetrating the molding layer 400 may be formed. The hole H may be formed to expose the first redistribution pads **123*b* of the first redistribution substrate 100, side surfaces of the first semiconductor chip 200 and/or side surfaces of the heat dissipation layer 210. After the hole H is formed, the hole H may be filled with a conductive material. The conductive material may be in contact with the first redistribution pads 123***b*, the side surfaces of the first semiconductor chip 200 and/or the side surface of the heat dissipation layer 210. The conductive material may include copper (Cu).

Figure 17:
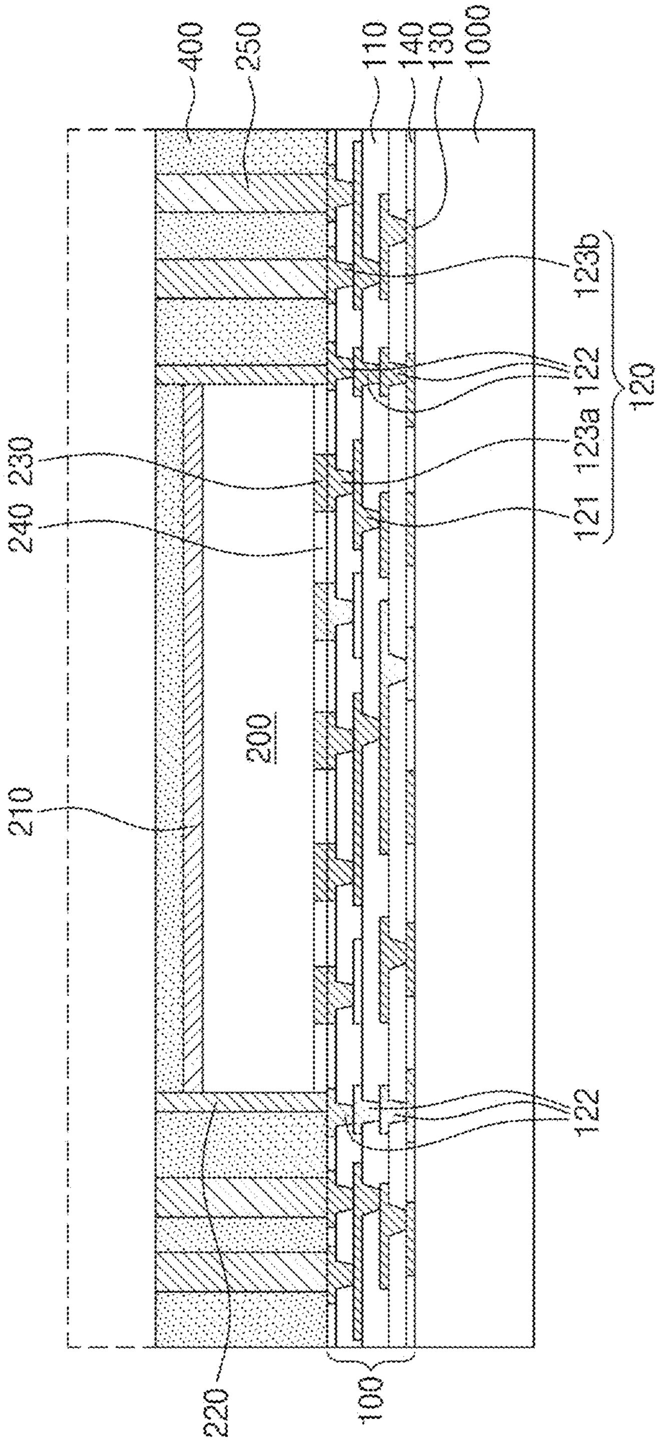

Referring to FIG. 17, a grinding process of the molding layer 400 may be performed. A portion of the molding layer 400 may be reduced, or removed, through the grinding process. Through the grinding process, an upper portion of the conductive material may be reduced, or removed, to form dummy patterns 220. If necessary, or sufficient, upper portions of the through electrodes 250 may be reduced, or removed, together. Upper surfaces of the dummy patterns 220 and/or through electrodes 250 may be exposed by the grinding process. Alternatively, an upper surface of the heat dissipation layer 210 may be exposed through the grinding process. The grinding process may be performed by, for example, a chemical mechanical polishing process (CMP).

Figure 18:
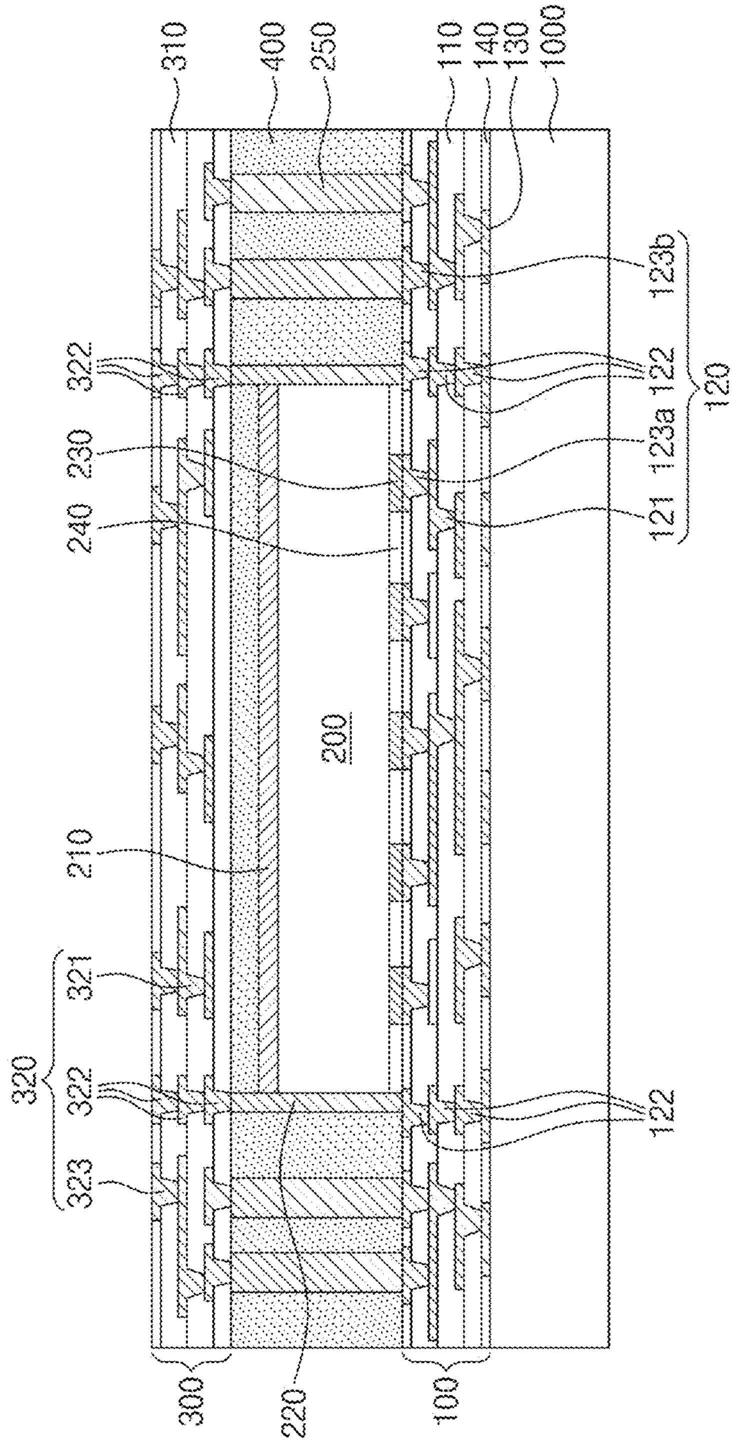

Referring to FIG. 18, a second insulating layer 310 may be formed on the molding layer 400. For example, the second insulating layer 310 may be formed by coating an insulating material on the molding layer 400. The insulating material may include, for example, an organic material such as a photo-imageable dielectric (PID) material. The photo-imageable dielectric material may be a polymer. The photo-imageable dielectric material may include, for example, at least one of photosensitive polyimide, polybenzoxazole, phenol-based polymer, and/or benzocyclobutene-based polymer.

Openings may be formed by patterning the second insulating layer 310. A metal layer may be formed to fill the openings of the second insulating layer 310 and cover the second insulating layer 310. Second redistribution patterns 320 may be formed in the second insulating layer 310 through the planarization process of the metal layer. The planarization process may be performed by, for example, a chemical mechanical polishing (CMP) process. The planarization process may be performed until an upper surface of the second insulating layer 310 is exposed. The second redistribution patterns 320 may include third wiring patterns 321, fourth wiring patterns 322, and/or second redistribution pads 323. The third wiring patterns 321 may be formed in the openings exposing upper surfaces of through electrodes 250 among the openings of second insulating layer 310. The fourth wiring patterns 322 may be formed in the openings exposing the upper surfaces of the dummy patterns 220 among the openings of the second insulating layer 310. The third wiring patterns 321 and/or the second redistribution pads 323 of the second redistribution patterns 320 may be formed to not be in direct contact with the fourth wiring patterns 322.

Although not shown, seed patterns may be formed conformally on the upper surface of the second insulating layer 310 and in the openings of the second insulating layer 310 before the second redistribution patterns 320 are formed. An electroplating process using the seed patterns as electrodes may be performed to form the second redistribution patterns 320. The second redistribution patterns 320 may be formed on the upper surface of the second insulating layer 310 and in the openings to cover the seed patterns. Each, or one or more, of the second redistribution patterns 320 may include a second via portion and/or a second wiring portion. The second via portion may be formed in the corresponding openings of the second insulating layer 310. The second wiring portion may be formed on the second via portion and may extend onto the upper surface of the second insulating layer 310.

Forming the second insulating layer 310, forming the seed patterns, and/or forming the second redistribution patterns 320 may be repeatedly performed. Accordingly, the stacked second insulating layer 310 and the stacked second redistribution patterns 320 may form a second redistribution substrate 300.

Figure 19:
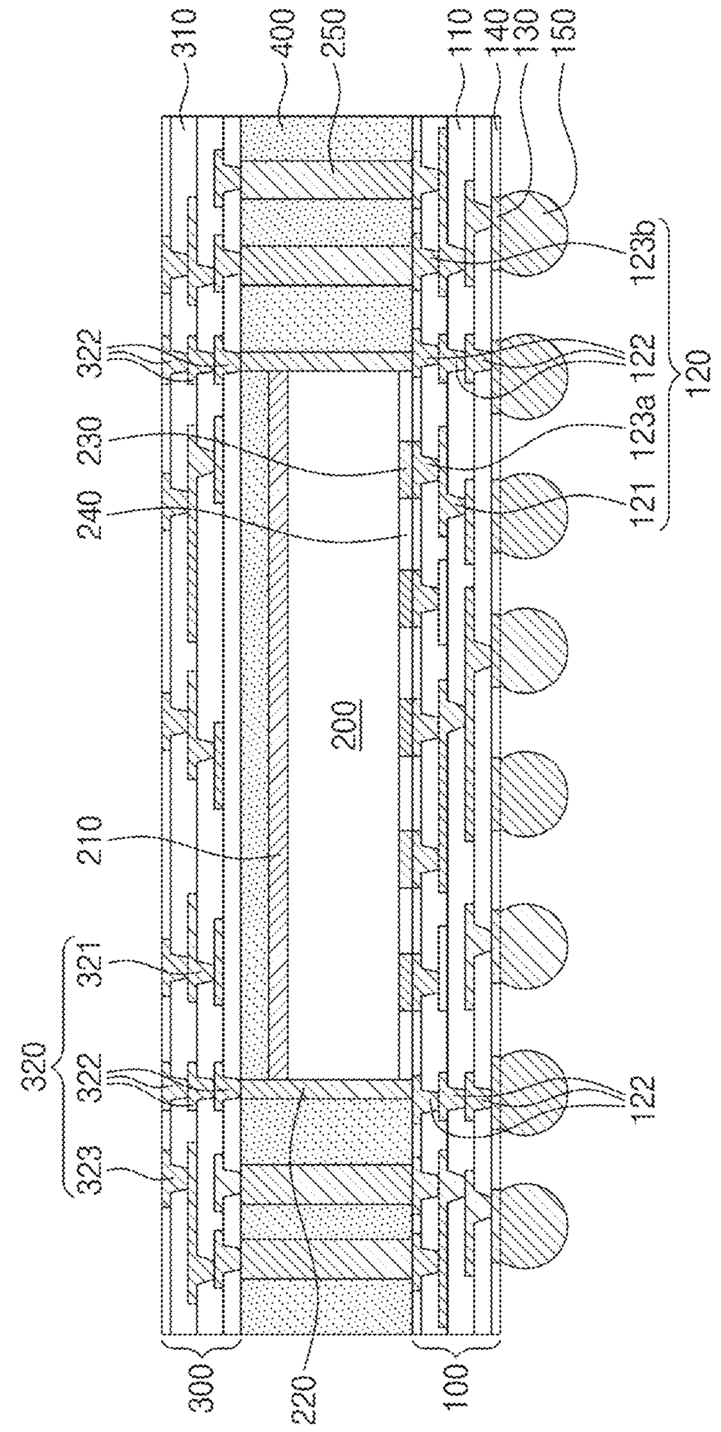

Referring to FIG. 19, substrate connection terminals 150 may be disposed on a lower surface of the first redistribution substrate 100. The substrate connection terminals 150 may be disposed on the substrate pads 130 provided on the lower surface of the first redistribution substrate 100. The substrate connection terminals 150 may include first substrate connection terminals connected to the first wiring patterns 121 and/or second substrate connection terminals connected to the second wiring patterns 122. The substrate connection terminals 150 may be spaced apart from each other.

Referring back to FIG. 1, the second semiconductor chip 500 may be disposed on the second redistribution substrate 300. The second semiconductor chip 500 may be disposed on the second redistribution substrate 300 in a face down manner. The second semiconductor chip 500 may be mounted on the second redistribution substrate 300 through first chip connection terminals 330. For example, after providing the first chip connection terminals 330 on second chip pads 501 on the lower surface of the second semiconductor chip 500, the second semiconductor chip 500 may be disposed on the second redistribution substrate 300 so that the second redistribution pads 323 of the second redistribution board 300 and the first chip connection terminals 330 are aligned. Thereafter, a reflow process may be performed on the first chip connection terminals 330 and the first chip connection terminals 330 may be connected to the second chip pads 501 and/or the second redistribution pads 323. Accordingly, the semiconductor package 10 of FIG. 1 may be manufactured.

The semiconductor package according to some example embodiments may include the heat dissipation layer provided on the semiconductor chip and/or the dummy patterns in contact with the side surface of the semiconductor chip and connected to the heat dissipation layer. The heat dissipation layer and/or the dummy patterns in contact with the semiconductor chip may easily dissipate heat generated from the semiconductor chip. Accordingly, the thermal stability of the semiconductor package may be improved.

While some example embodiments are described above, a person skilled in the art may understand that many modifications and variations are made without departing from the spirit and scope of the inventive concepts defined in the following claims. Accordingly, the example embodiments of the inventive concepts should be considered in all respects as illustrative and not restrictive, with the spirit and scope of the inventive concepts being indicated by the appended claims.

What is claimed is:

1. A semiconductor package comprising:

a first redistribution substrate;

a first semiconductor chip on the first redistribution substrate;

a heat dissipation layer on the first semiconductor chip and in contact with an upper surface of the first semiconductor chip;

a second redistribution substrate on the heat dissipation layer;

a molding layer surrounding the first semiconductor chip and the heat dissipation layer between the first redistribution substrate and the second redistribution substrate;

through electrodes vertically penetrating the molding layer and electrically connecting the first redistribution substrate and the second redistribution substrate, the through electrodes being spaced apart from the first semiconductor chip and the heat dissipation layer; and dummy patterns vertically penetrating the molding layer and in contact with a side surface of the first semiconductor chip and a side surface of the heat dissipation layer, the dummy patterns extending above a top surface of the first semiconductor chip, wherein the first redistribution substrate includes, a first insulating layer, first wiring patterns in the first insulating layer and electrically connecting the first semiconductor chip and the through electrodes, and second wiring patterns in the first insulating layer, electrically connected to the dummy patterns, and electrically insulated from the first wiring patterns.

2. The semiconductor package of claim 1, wherein the dummy patterns include a metal.

3. The semiconductor package of claim 1, wherein the side surface of the first semiconductor chip and the side surface of the heat dissipation layer have a concave portion toward an inside of the first semiconductor chip and an inside of the heat dissipation layer, and at least a portion of a side surface of each of the dummy patterns is in contact with the concave portion.

4. The semiconductor package of claim 1, further comprising a second semiconductor chip mounted on the second redistribution substrate through a chip connection terminal.

5. The semiconductor package of claim 4, wherein the second redistribution substrate includes:

a second insulating layer;

third wiring patterns in the second insulating layer and electrically connected to the second semiconductor chip; and fourth wiring patterns in the second insulating layer, connected to the dummy patterns, and electrically insulated from the third wiring patterns.

6. The semiconductor package of claim 1, further comprising a third semiconductor chip between the first semiconductor chip and the second redistribution substrate, wherein the heat dissipation layer is between the first semiconductor chip and the third semiconductor chip.

7. The semiconductor package of claim 1, wherein the first semiconductor chip includes a chip pad provided on a lower surface of the first semiconductor chip, the first wiring patterns include redistribution pads exposed onto the first redistribution substrate, and the chip pad and the redistribution pad are in contact with each other and form an integral body.

8. The semiconductor package of claim 1, further comprising substrate connection terminals on a lower surface of the first redistribution substrate, wherein the substrate connection terminals include first substrate connection terminals connected to the first wiring patterns and second substrate connection terminals connected to the second wiring patterns.

9. The semiconductor package of claim 1, wherein the dummy patterns surround the first semiconductor chip and the heat dissipation layer.

10. A semiconductor package comprising:

a first substrate;

a chip structure on the first substrate, the chip structure including a first semiconductor chip and a heat dissipation layer covering an upper surface of the first semiconductor chip;

a second substrate on the chip structure;

dummy patterns extending from a top of the first semiconductor chip to a bottom of the first semiconductor chip and connecting the first substrate and the second substrate and in contact with a side surface of the chip structure; and a connection structure electrically connecting the first substrate and the second substrate and spaced apart from the chip structure, wherein the side surface of the chip structure has a concave portion toward an inside of the chip structure, and a side surface of each of the dummy patterns is in contact with the concave portion.

11. The semiconductor package of claim 10, wherein the first substrate includes:

a first insulating layer;

first wiring patterns in the first insulating layer and electrically connecting the first semiconductor chip and the connection structure; and second wiring patterns in the first insulating layer, electrically connected to the dummy patterns, and electrically insulated from the first wiring patterns.

12. The semiconductor package of claim 10, wherein the heat dissipation layer is in contact with an upper surface of the first semiconductor chip.

13. The semiconductor package of claim 10, further comprising a second semiconductor chip mounted on the second substrate through a chip connection terminal.

14. The semiconductor package of claim 13, wherein the second substrate includes:

a second insulating layer;

third wiring patterns in the second insulating layer and electrically connected to the second semiconductor chip; and fourth wiring patterns in the second insulating layer, electrically connected to the dummy patterns, and electrically insulated from the third wiring patterns.

15. The semiconductor package of claim 14, wherein a portion of the fourth wiring patterns is exposed onto an upper surface of the second substrate.

16. The semiconductor package of claim 10, further comprising a third semiconductor chip on the second substrate and between the first semiconductor chip and the second substrate, wherein the heat dissipation layer is between the first semiconductor chip and the third semiconductor chip.

17. A semiconductor package comprising:

a first redistribution substrate;

a chip structure on the first redistribution substrate, the chip structure including a first semiconductor chip and a heat dissipation layer in contact with an upper surface of the first semiconductor chip;

through electrodes spaced apart from the chip structure on the first redistribution substrate;

dummy patterns between the chip structure and the through electrodes on the first redistribution substrate and in contact with a side surface of the first semiconductor chip and a side surface of the heat dissipation layer, the dummy patterns extending above a top surface of the first semiconductor chip;

a molding layer surrounding the chip structure, the dummy patterns, and the through electrodes;

a second redistribution substrate covering the molding layer; and a second semiconductor chip mounted on the second redistribution substrate through a chip connection terminal, wherein the heat dissipation layer includes a metal.

18. The semiconductor package of claim 17, wherein the first redistribution substrate includes, a first insulating layer, first wiring patterns in the first insulating layer and electrically connecting the first semiconductor chip and the through electrodes, and second wiring patterns in the first insulating layer, connected to the dummy patterns, and electrically insulated from the first wiring patterns, and the second redistribution substrate includes, a second insulating layer, third wiring patterns in the second insulating layer and electrically connecting the second semiconductor chip and the through electrodes, and fourth wiring patterns provided in the second insulating layer, connected to the dummy patterns, and electrically insulated from the third wiring patterns.

19. The semiconductor package of claim 17, wherein the side surface of the chip structure has a concave portion toward an inside of the chip structure, and at least a portion of a side surface of each of the dummy patterns is in contact with the concave portion.

20. The semiconductor package of claim 17, wherein the first semiconductor chip includes a chip pad on a lower surface of the first semiconductor chip, the first wiring patterns include redistribution pads exposed onto the first redistribution substrate, and the chip pad and the redistribution pad are in contact with each other and form an integral body.

* * * * *